(12) United States Patent
Harada et al.

(10) Patent No.: US 8,895,431 B2
(45) Date of Patent: Nov. 25, 2014

(54) METHOD FOR FABRICATING SEMICONDUCTOR DEVICE

(71) Applicant: Panasonic Corporation, Osaka (JP)

(72) Inventors: Takeshi Harada, Toyama (JP); Toru Hinomura, Toyama (JP); Naoki Torazawa, Toyama (JP); Tatsuya Kabe, Toyama (JP)

(73) Assignee: Panasonic Corporation, Osaka (JP)

( * ) Notice: Subject to any disclaimer, the term of this patent is extended or adjusted under 35 U.S.C. 154(b) by 166 days.

(21) Appl. No.: 13/690,784

(22) Filed: Nov. 30, 2012

(65) Prior Publication Data

US 2013/0095652 A1 Apr. 18, 2013

Related U.S. Application Data

(63) Continuation of application No. PCT/JP2011/002291, filed on Apr. 19, 2011.

(30) Foreign Application Priority Data

Oct. 7, 2010 (JP) .................................. 2010-227648

(51) Int. Cl.
*H01L 21/311* (2006.01)
*H01L 21/768* (2006.01)
*H01L 21/3205* (2006.01)

(52) U.S. Cl.
CPC ........ *H01L 21/768* (2013.01); *H01L 21/31144* (2013.01); *H01L 21/3205* (2013.01); *H01L 21/76811* (2013.01)
USPC ............ 438/637; 438/702; 438/717; 438/734

(58) Field of Classification Search
CPC .................. H01L 21/31144; H01L 21/76811; H01L 21/3081

USPC ............... 438/637, 702, 717, 734, FOR. 388
See application file for complete search history.

(56) References Cited

U.S. PATENT DOCUMENTS 7,144,750 B2 * 12/2006 Ouellet et al. .................. 438/50
8,247,332 B2 * 8/2012 Rangarajan et al. .......... 438/694

(Continued)

FOREIGN PATENT DOCUMENTS

JP 2003-100871 A 4/2003
JP 2008-210929 A 9/2008

(Continued)

OTHER PUBLICATIONS

J. Ducoté et al., "Wiggling of porous dielectric lines of advanced technological node: from simulation to experiment". 2009 Dry Process International Symposium, pp. 131-132.

(Continued)

Primary Examiner — George Fourson, III
(74) Attorney, Agent, or Firm — McDermott Will & Emery LLP

(57) ABSTRACT

A method for fabricating a semiconductor device includes: forming an interlayer insulating film on a substrate; forming a first hard mask formation film on the interlayer insulating film; altering the first hard mask formation film; after the altering of the first hard mask formation film, transferring an interconnect groove pattern to the altered first hard mask formation film to form a first hard mask made of the altered first hard mask formation film; and etching the interlayer insulating film using the first hard mask to form an interconnect groove in the interlayer insulating film. The first hard mask formation film is made of a metal film or a metallic compound film.

11 Claims, 28 Drawing Sheets

(56) References Cited

U.S. PATENT DOCUMENTS

| | | | |
|---|---|---|---|
| 8,252,699 B2 * | 8/2012 | Konecni et al. | 438/763 |
| 8,282,842 B2 * | 10/2012 | Wang et al. | 216/17 |
| 8,614,144 B2 * | 12/2013 | Kato | 438/667 |
| 2003/0008490 A1 | 1/2003 | Xing et al. | |
| 2008/0014728 A1 | 1/2008 | Rossi et al. | |
| 2013/0203266 A1 * | 8/2013 | Hintze et al. | 438/763 |
| 2014/0175617 A1 * | 6/2014 | Antonelli et al. | 257/632 |

FOREIGN PATENT DOCUMENTS

| | | |
|---|---|---|
| JP | 2008-311543 A | 12/2008 |
| JP | 2009-283812 A | 12/2009 |

OTHER PUBLICATIONS

International Search Report mailed Aug. 2, 2011 issued in corresponding International Applciation No. PCT/JP2011/002291.

* cited by examiner

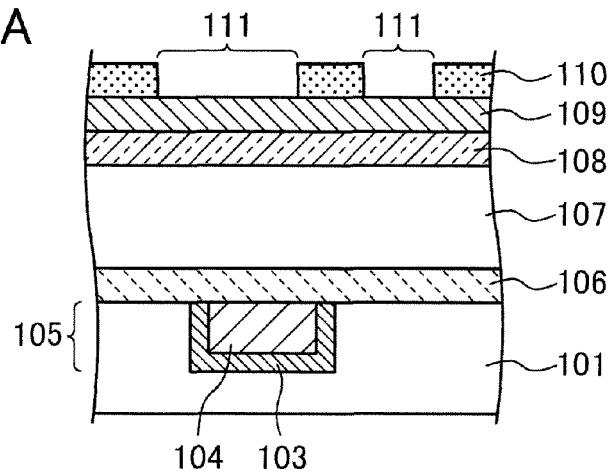
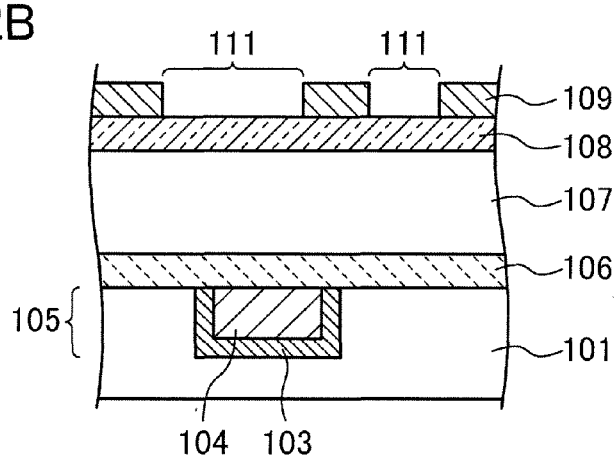
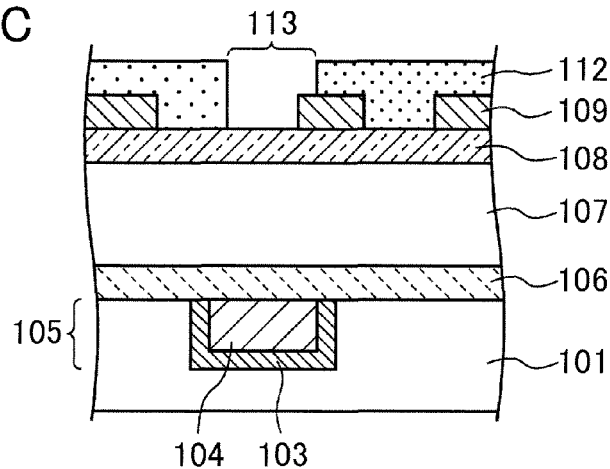

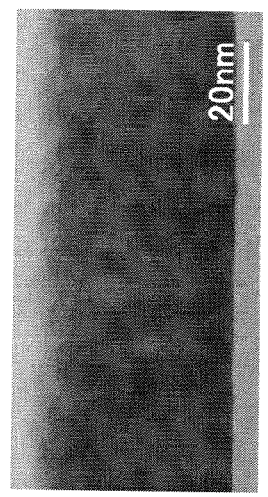
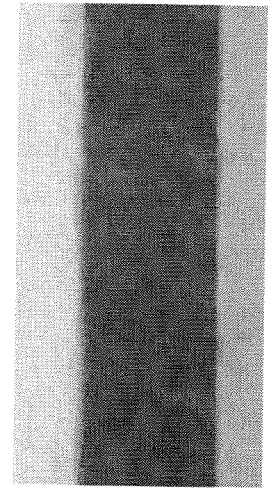
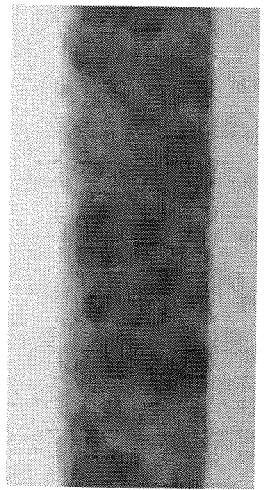
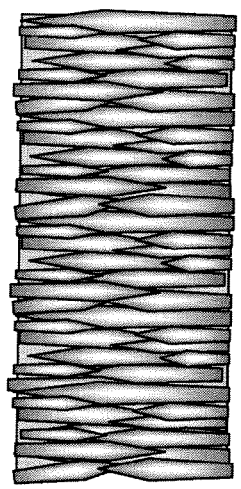
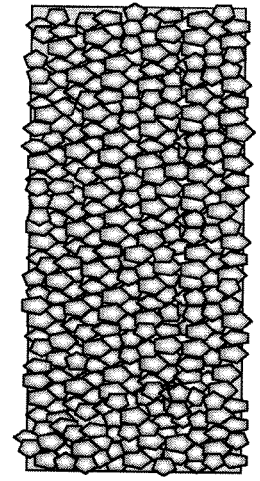
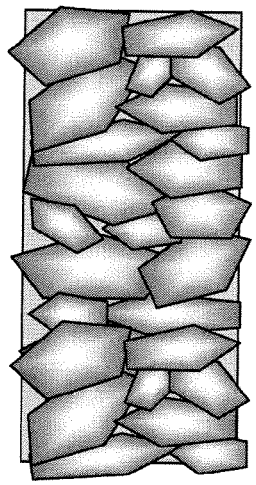

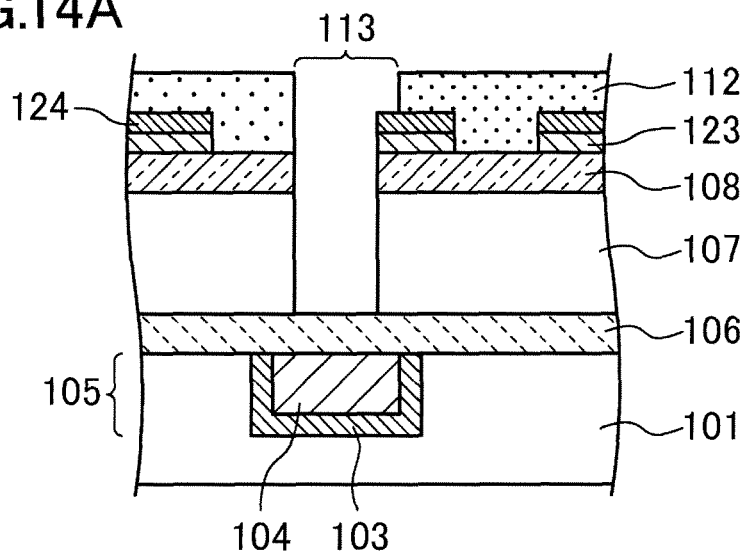
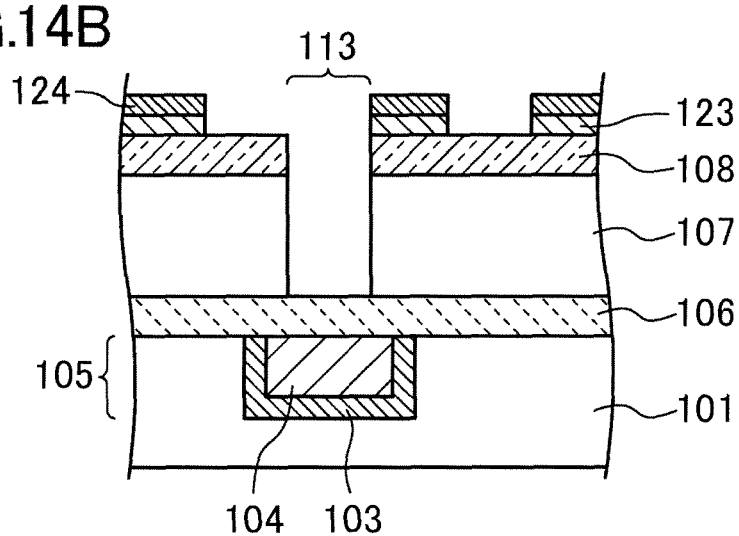
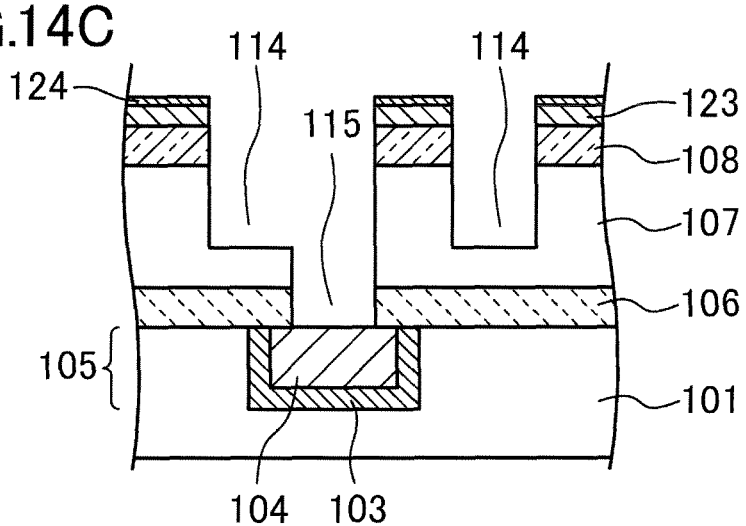

FIG.19

| | LOWER METAL FILM | | UPPER METAL FILM | |
|---|---|---|---|---|
| | FEATURES | OBJECTS | FEATURES | OBJECTS |
| FIRST VARIATION | LOW STRESS | TO PREVENT POOR FILLING OF INTERCONNECT GROOVE WITH Cu | HIGH DENSITY | TO PROVIDE STABLE SIZE OF INTERCONNECT GROOVE PATTERN |
| SECOND VARIATION | EASY TO ETCH IN PROCESS STEP IN FIG. 13B | TO REDUCE FABRICATION COST | HIGH DENSITY | TO PROVIDE STABLE SIZE OF INTERCONNECT GROOVE PATTERN |
| THIRD VARIATION | HARD TO ETCH IN PROCESS STEP IN FIG. 14A | TO CONTROL SHAPE OF VIA 115 | HARD TO ETCH IN PROCESS STEP IN FIG. 14C | TO CONTROL SHAPE OF INTERCONNECT GROOVE 114 |

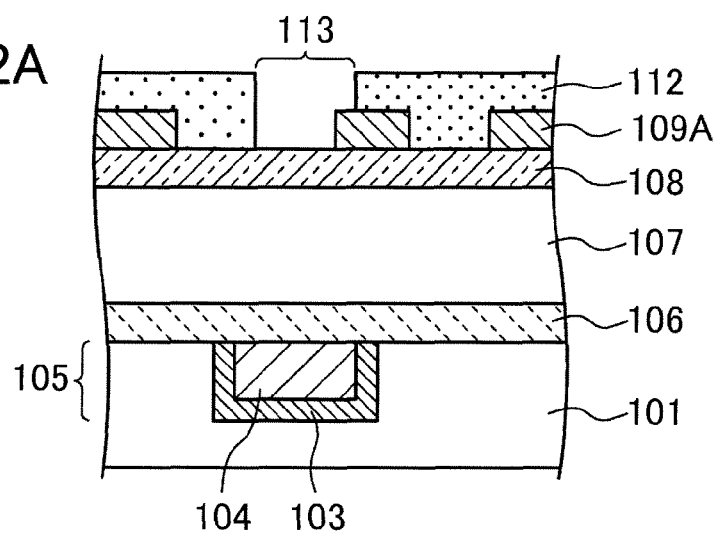
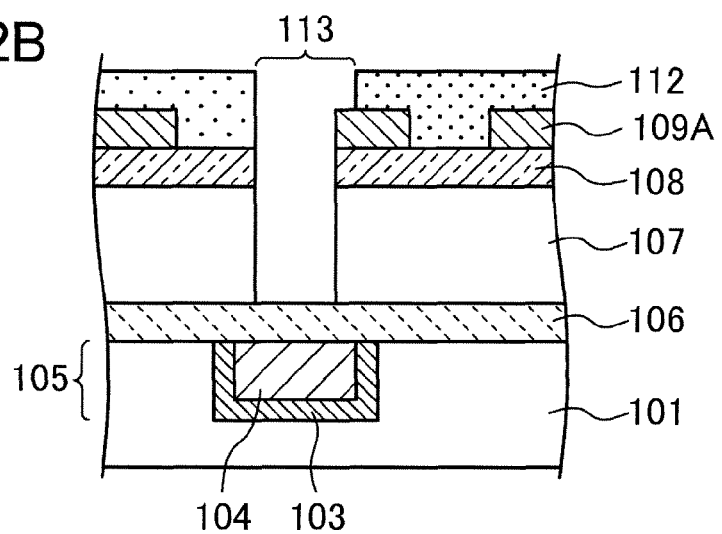
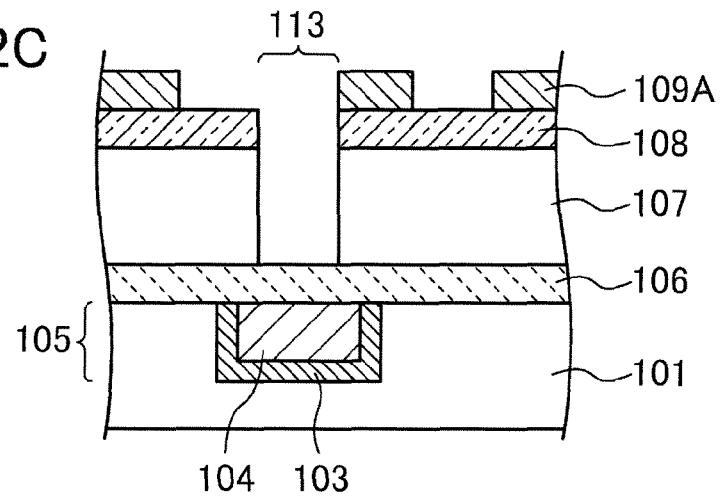

METHOD FOR FABRICATING SEMICONDUCTOR DEVICE

CROSS-REFERENCE TO RELATED APPLICATIONS

This is a continuation of PCT International Application PCT/JP2011/002291 filed on Apr. 19, 2011, which claims priority to Japanese Patent Application No. 2010-227648 filed on Oct. 7, 2010. The disclosures of these applications including the specifications, the drawings, and the claims are hereby incorporated by reference in their entirety.

BACKGROUND

The present disclosure relates to methods for fabricating a semiconductor device, and more particularly relates to a method for fabricating a multilayer interconnect structure.

In recent years, with miniaturization of semiconductor integrated circuit devices, the spacing between an adjacent pair of interconnects providing connection between devices and disposed in a device has been narrowed. Thus, a problem where the capacitance between interconnects increases, and the propagation speed of a signal decreases is occurring. To address this problem, a method has been actively studied in which the capacitance between interconnects is reduced by using, e.g., a silicon oxycarbide (SiOC) film having a low dielectric constant as an insulating film.

Generally, the SiOC film tends to be altered by a process. Thus, instead of a process in which a conventional resist mask is used, a process in which a hard mask made of, e.g., a titanium nitride (TiN) film is used has been suggested (see, for example, Japanese Patent Publication No. 2003-100871).

SUMMARY

However, close studies of the inventors of this application revealed that a method in which a semiconductor device is fabricated using a conventional hard mask has the following problem. When miniaturization of semiconductor devices and a reduction in the dielectric constant of an interlayer insulating film are pursued, a separation portion of an interlayer insulating film separating interconnects from one another tends to be deformed due to stress induced by a hard mask. This deformation tends to cause poor filling of an interconnect groove with a conductive material for an interconnect, resulting in a reduction in each of the yield and reliability of the semiconductor device.

An object of the present disclosure is to achieve a semiconductor device fabrication method which reduces the deformation of a separation portion of an interlayer insulating film, and is less likely to cause poor filling of an interconnect groove with a conductive material for an interconnect.

An example method for fabricating a semiconductor device according to a first aspect of the present disclosure includes: forming an interlayer insulating film on a substrate; forming a first hard mask formation film on the interlayer insulating film; transferring an interconnect groove pattern to the first hard mask formation film to form a first hard mask made of the first hard mask formation film; and etching the interlayer insulating film using the first hard mask to form an interconnect groove in the interlayer insulating film. In the forming of the first hard mask formation film, the first hard mask formation film has a compressive stress greater than or equal to 0 Pa and equal to or less than 1000 MPa.

In the method of the first aspect, the forming of the first hard mask formation film may include subjecting the first hard mask formation film to heat treatment. In this case, the subjecting of the first hard mask formation film to heat treatment preferably includes performing heat treatment in a nitrogen atmosphere at a temperature greater than or equal to 100° C. and equal to or less than 400° C.

In the method of the first aspect, the forming of the first hard mask formation film may include subjecting the first hard mask formation film to plasma treatment. In this case, the subjecting of the first hard mask formation film to plasma treatment preferably includes performing plasma treatment in an atmosphere containing hydrogen ($H_2$) and oxygen ($O_2$) at a temperature greater than or equal to 100° C. and equal to or less than 400° C.

The method of the first aspect may further include: before the forming of the first hard mask formation film, performing a cooldown process.

In the method of the first aspect, the first hard mask formation film is preferably made of a metal film or a metallic compound film.

In the method of the first aspect, the forming of the first hard mask formation film may include forming the first hard mask formation film by chemical vapor deposition or atomic layer deposition using an organic metallic compound.

In this case, the forming of the first hard mask formation film may include forming the first hard mask formation film by reactive physical vapor deposition.

In this case, the first hard mask formation film may be made of TiN, and the forming of the first hard mask formation film may include performing reactive physical vapor deposition at an $N_2$ mole fraction greater than or equal to 0.35 and equal to or less than 0.75.

Alternatively, the first hard mask formation film may be made of TiN, and the forming of the first hard mask formation film may include performing reactive physical vapor deposition at a target application power greater than or equal to 0.5 kW and equal to or less than 7 kW.

Alternatively, the first hard mask formation film may be made of TiN, and the forming of the first hard mask formation film may include performing reactive physical vapor deposition at an internal chamber pressure greater than or equal to 15 mTorr and equal to or less than 150 mTorr.

Alternatively, the first hard mask formation film may be made of TiN, and the forming of the first hard mask formation film may include performing reactive physical vapor deposition at a deposition temperature greater than or equal to 25° C. and equal to or less than 200° C.

In the method of the first aspect, the forming of the first hard mask formation film may include: stacking a second hard mask formation film on the first hard mask formation film. In the transferring of the interconnect groove pattern, the interconnect groove pattern may be transferred to the first and second hard mask formation films to form the first hard mask made of the first hard mask formation film and a second hard mask made of the second hard mask formation film, and in the etching of the interlayer insulating film, the interlayer insulating film may be etched using the first and second hard masks to form the interconnect groove in the interlayer insulating film.

In the method of the first aspect, the first hard mask formation film preferably has a smaller crystal size than the second hard mask formation film.

In the method of the first aspect, the second hard mask formation film preferably has a higher compressive stress than the first hard mask formation film.

In the method of the first aspect, the second hard mask formation film preferably has a higher density than the first hard mask formation film.

In the method of the first aspect, the second hard mask formation film preferably has a density greater than or equal to 4.5 g/cm$^3$ and equal to or less than 5.3 g/cm$^3$.

In the method of the first aspect, after the etching of the interlayer insulating film, it is preferable that the second hard mask is completely removed, or has a thickness equal to or less than 5 nm.

In the method of the first aspect, it is preferable that a reflectivity of the first hard mask formation film is substantially equal to a reflectivity of the second hard mask formation film, and an attenuation coefficient of the first hard mask formation film is substantially equal to an attenuation coefficient of the second hard mask formation film.

In the method of the first aspect, the first and second hard mask formation films may contain an identical metal element.

In the method of the first aspect, the first and second hard mask formation films are preferably made of a metal film or a metallic compound film.

An example method for fabricating a semiconductor device according to a second aspect of the present disclosure includes: forming an interlayer insulating film on a substrate; sequentially stacking first and second hard mask formation films on the interlayer insulating film; transferring an interconnect groove pattern to the first and second hard mask formation films to form a first hard mask made of the first hard mask formation film and a second hard mask made of the second hard mask formation film; and etching the interlayer insulating film using the first and second hard masks to form an interconnect groove in the interlayer insulating film. In the sequentially stacking of the first and second hard mask formation films, the first hard mask formation film has a smaller crystal size than the second hard mask formation film.

The method of the first or second aspect may further include: after the etching of the interlayer insulating film, forming an interconnect made of a conductive material in the interconnect groove. In this case, the conductive material preferably contains Cu.

In the method of the first or second aspect, the etching of the interlayer insulating film may include forming the interconnect groove including at least three adjacent interconnect grooves between each adjacent pair of which a separation portion of the interlayer insulating film is interposed.

In the method of the first or second aspect, the interlayer insulating film may include a multilayer film of a silicon oxycarbide film having a relative dielectric constant of 2.5, and a silicon oxycarbide film having a relative dielectric constant of 3.0.

An example method for fabricating a semiconductor device according to a third aspect of the present disclosure includes: forming an interlayer insulating film on a substrate; forming a hard mask formation film on the interlayer insulating film; subjecting the hard mask formation film to heat treatment or plasma treatment; after the subjecting of the hard mask formation film, transferring an interconnect groove pattern to the hard mask formation film to form a hard mask made of the hard mask formation film; and etching the interlayer insulating film using the hard mask to form an interconnect groove in the interlayer insulating film.

Even with miniaturization of semiconductor devices, the semiconductor device fabrication method of the present disclosure can reduce the deformation of a separation portion of an interlayer insulating film in an multilayer interconnect structure to prevent poor filling of an interconnect groove with a conductive material for interconnects. Consequently, the yield and reliability of the semiconductor device can be improved.

BRIEF DESCRIPTION OF THE DRAWINGS

FIGS. 2A-2C are cross-sectional views illustrating process steps in the method for fabricating a semiconductor device according to the first embodiment.

FIGS. 5A and 5B illustrate an examination pattern for examining stresses in a semiconductor device according to the first embodiment, in which FIG. 5A is a plan view of the examination pattern, and FIG. 5B is a cross-sectional view taken along the line Vb-Vb in FIG. 5A.

FIGS. 9A-9C are transmission electron microscope (TEM) images of the TiN film deposited by PVD, and FIGS. 9D, 9E, and 9F are diagrams schematically illustrating the states of crystals in FIGS. 9A, 9B, and 9C, respectively.

FIGS. 14A-14C are cross-sectional views illustrating process steps in the method for fabricating a semiconductor device according to the second embodiment.

FIG. 19 is a table illustrating the characteristics of variations of each of the metal films in the semiconductor device according to the second embodiment.

FIGS. 22A-22C are cross-sectional views illustrating process steps in the method for fabricating a semiconductor device according to the third embodiment.

FIGS. 32A-32D illustrate a comparison between the deformation of a separation portion under high stress and that under low stress, in which FIGS. 32A and 32B are plan views, FIG. 32C is a cross-sectional view taken along the line XXXIIa-XXXIIa in FIG. 32A, and FIG. 32D is a cross-sectional view taken along the line XXXIIb-XXXIIb in FIG. 32B.

FIGS. 37A and 37B illustrate stress simulation conditions and results in the process step in FIG. 29B, in which FIG. 37A is a perspective view, and FIG. 37B is a cross-sectional view taken along the line XXXVIIb-XXXVIIb in FIG. 37A.

DETAILED DESCRIPTION

First, problems found by the inventors of this application, and caused in a method for fabricating a semiconductor device having a multilayer interconnect structure will be described.

Figure 27A:
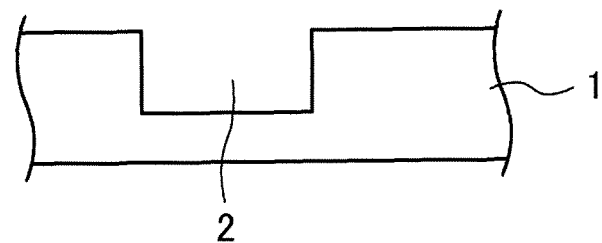
FIGS. 27A-27C are cross-sectional views illustrating process steps in a semiconductor device fabrication method which was used to examine problems of the fabrication method.

The following method for fabricating a semiconductor device having a multilayer interconnect structure was used to examine problems. First, as illustrated in FIG. 27A, an insulating film 1 is deposited on the surface of a semiconductor substrate (not shown), and then, an interconnect groove 2 is formed in the insulating film 1 by photolithography and dry etching.

Figure 27B:
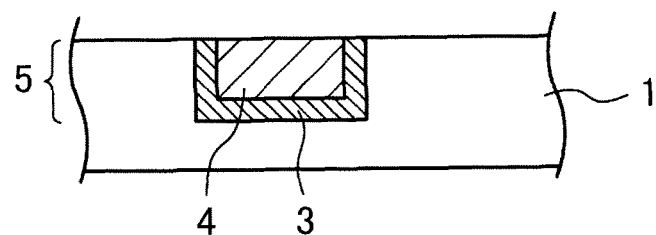

Next, as illustrated in FIG. 27B, a barrier film 3 and a copper (Cu) film 4 are deposited to cover the surface of the insulating film 1 and fill the interior of the interconnect groove 2, and then, a portion of the barrier film 3 and a portion of the Cu film 4 which are located outside the interconnect groove 2 are removed by chemical mechanical polishing (CMP). Thus, a lower interconnect 5 including a portion of the barrier film 3 and a portion of the Cu film 4 both in the interior of the interconnect groove 2 is formed.

Figure 27C:
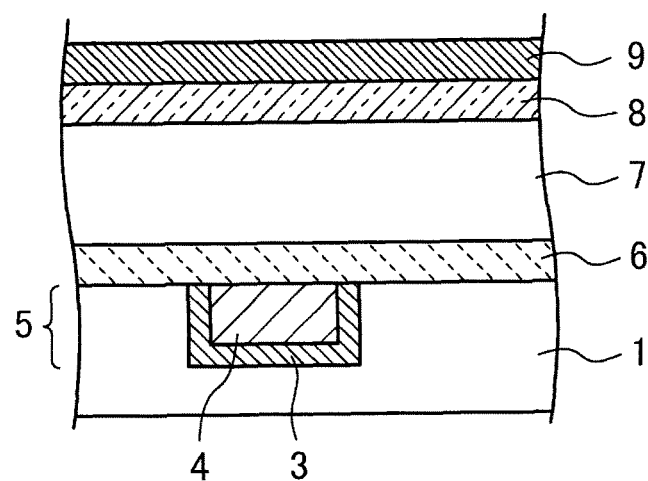

Next, as illustrated in FIG. 27C, a silicon carbide (SiC) film 6, a silicon oxycarbide (SiOC) film 7, a silicon dioxide (SiO$_2$) film 8, and a titanium nitride (TiN) film 9 are sequentially deposited on the surface of the insulating film 1 and the surface of the lower interconnect 5.

Figure 28A:
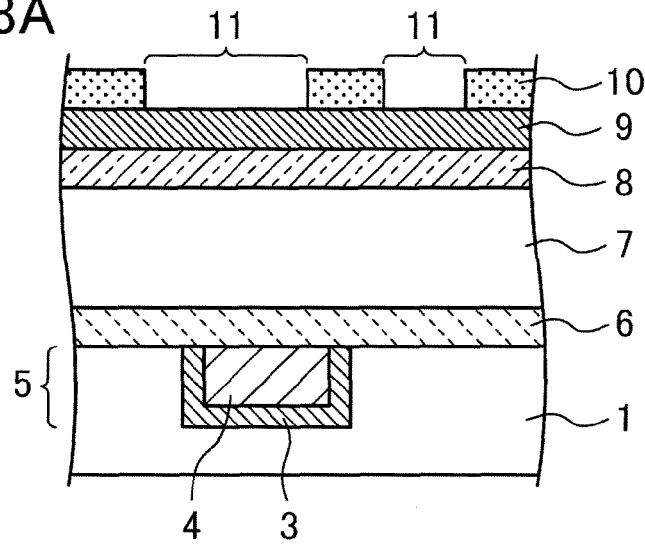
FIGS. 28A-28C are cross-sectional views illustrating process steps in the semiconductor device fabrication method which was used to examine problems of the fabrication method.

Next, as illustrated in FIG. 28A, a resist 10 is deposited on the surface of the TiN film 9, and then, interconnect groove patterns 11 are transferred to the resist 10 by lithography.

Figure 28B:
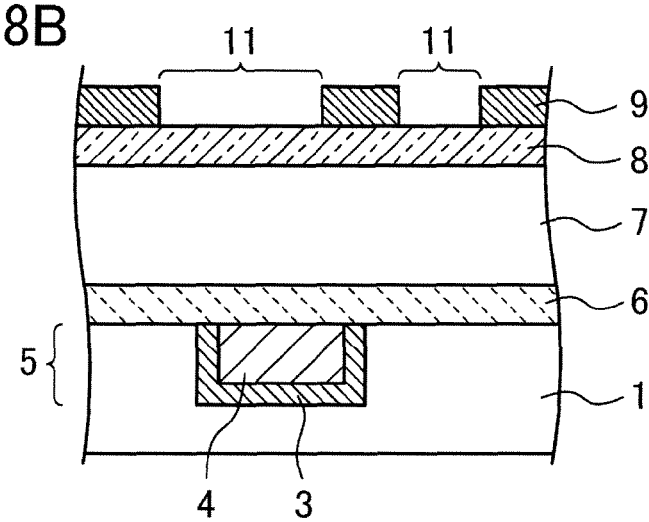

Next, as illustrated in FIG. 28B, the TiN film 9 is etched using the resist 10 as a mask, and then, the resist 10 is removed.

Figure 28C:
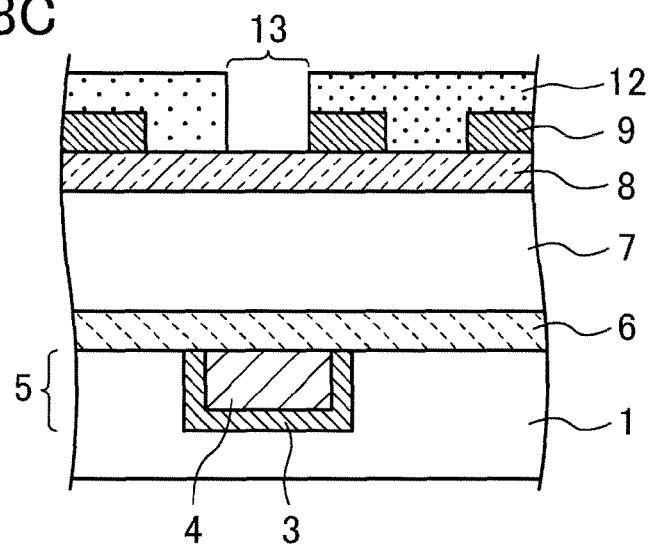

Next, as illustrated in FIG. 28C, a resist 12 is deposited to cover the surfaces of the SiO$_2$ film 8 and TiN film 9, and then, a via pattern 13 is transferred to the resist 12 by lithography.

Figure 29A:
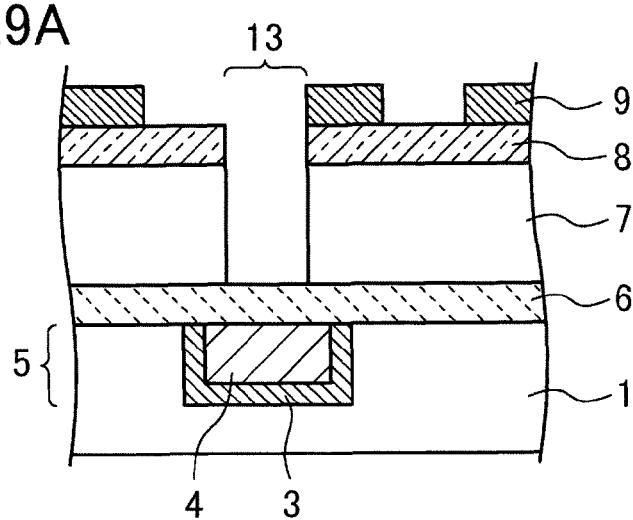
FIGS. 29A-29C are cross-sectional views illustrating process steps in the semiconductor device fabrication method which was used to examine problems of the fabrication method.

Next, as illustrated in FIG. 29A, the SiO$_2$ film 8 and the SiOC film 7 are etched using the resist 12 as a mask, and then, the resist 12 is removed.

Figure 29B:
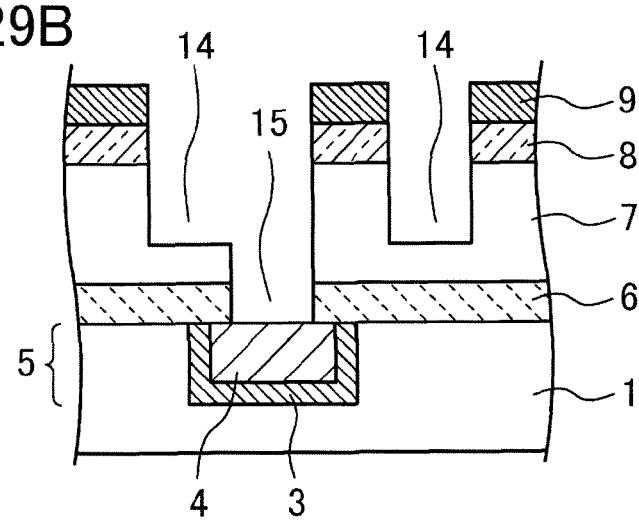

Next, as illustrated in FIG. 29B, the SiO$_2$ film 8, the SiOC film 7, and the SiC film 6 are etched using the TiN film 9 as a mask to form interconnect grooves 14 and a via hole 15. Similarly to the TiN film 9 in this situation, a mask made of a material other than a resist is generally referred to as a "hard mask."

Figure 29C:
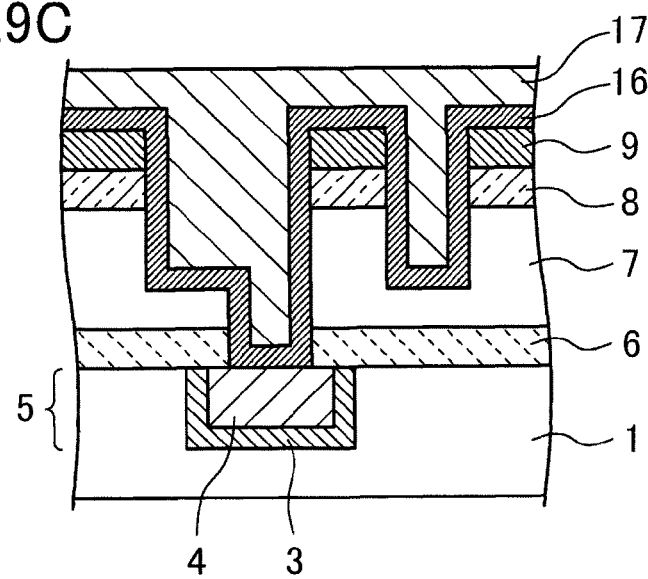

Next, as illustrated in FIG. 29C, a barrier film 16 and a Cu film 17 are sequentially deposited to cover the surface of the TiN film 9 and fill the interiors of the interconnect grooves 14 and the interior of the via hole 15.

Figure 30:
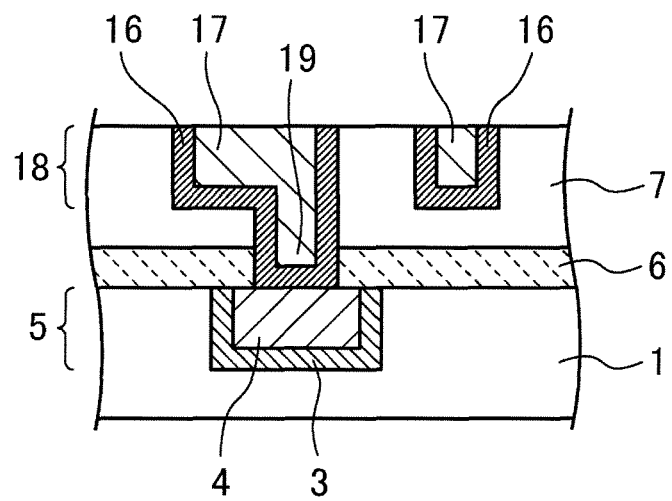
FIG. 30 is a cross-sectional view illustrating a process step in the semiconductor device fabrication method which was used to examine problems of the fabrication method.

Next, as illustrated in FIG. 30, a portion of the Cu film 17 and a portion of the barrier film 16 which are located outside each of the interconnect grooves 14, the TiN film 9, and the SiO$_2$ film 8 are removed by CMP. Thus, upper interconnects 18 each including a portion of the barrier film 16 and a portion of the Cu film 17 both in a corresponding one of the interconnect grooves 14, and a via 19 including a portion of the barrier film 16 and a portion of the Cu film 17 both in the via hole 15 are formed.

Figure 31:
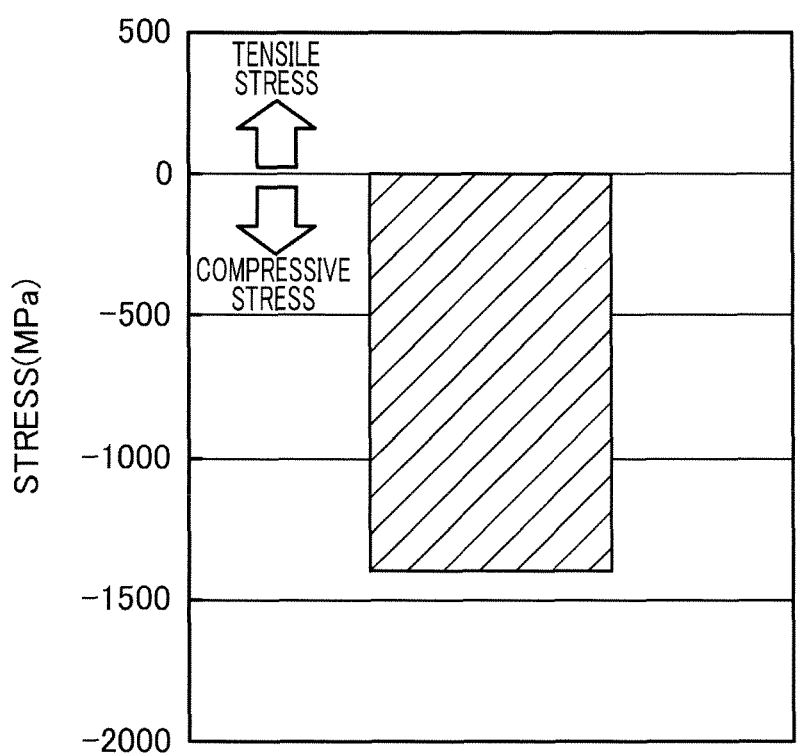
FIG. 31 is a graph illustrating a measurement result of the stress of a TiN film.

FIG. 31 illustrates a measurement result of the stress of the TiN film 9 deposited in the process step in FIG. 27C. FIG. 31 shows that the TiN film 9 has a very high compressive stress (about −1400 MPa). The situation in which the TiN film 9 has compressive stress means the situation in which the size of the TiN film 9 is smaller than that in equilibrium due to external forces applied from the SiOC film 7 or the SiO$_2$ film 8 to the TiN film 9. In other words, the above situation means the situation in which the TiN film 9 itself may expand against the external forces to deform the SiOC film 7 or the SiO$_2$ film 8. As such, when the TiN film 9 has very high compressive stress, this may significantly affect, e.g., pattern formation in a process for fabricating a semiconductor device.

The strain ∈ of the TiN film 9 can be determined by utilizing the following relational expression:

[Young's modulus $E$]=[Stress $\sigma$]/[Strain $\in$]

When the Young's modulus E of the TiN film 9 is set at 300 GPa based on literature data, the strain E under a compressive stress σ of −1400 MPa is −0.0046 based on the following expression:

[Strain $\in$]=[Stress $\sigma$(−1400 MPa)]/[Young's modulus $E$(300 GPa)]

Specifically, the size of the TiN film 9 deposited in the process step in FIG. 27C is 0.46% smaller than the reference value in a stress-free state. Therefore, in order to reduce the compressive stress of the TiN film 9, the TiN film 9 needs to be expanded by 0.46% in the direction perpendicular to the thickness direction of the TiN film 9.

Next, the influence of the compressive stress of the TiN film 9 on pattern formation in a process for fabricating a semiconductor device will be described. FIGS. 32A-32D illustrate a portion of a semiconductor device in which separation portions 20a, 20b, and 20c of the SiOC film 7 for separating interconnects from one another are adjacent to portions 14a, 14b, and 14c of an interconnect groove 14, respectively. The separation portion 20b has a minimum width (e.g., 60 nm) allowed by design rules, and the separation portions 20a and 20c have a width (e.g., 300 nm) greater than the width of the separation portion 20b.

Figure 32A:
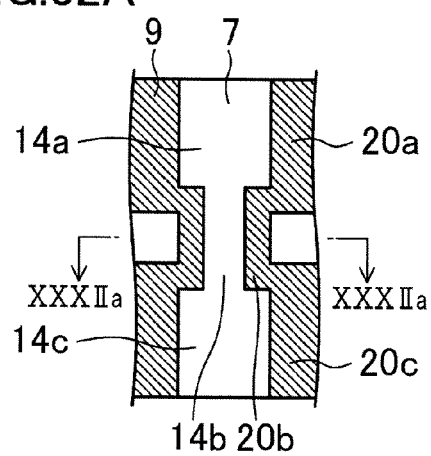
Figure 32B:
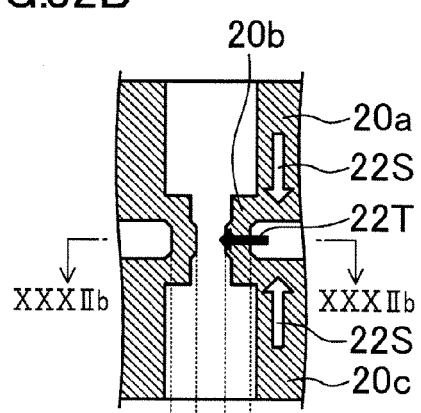
Figure 32C:
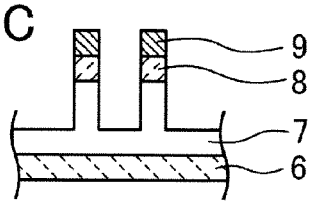
Figure 32D:
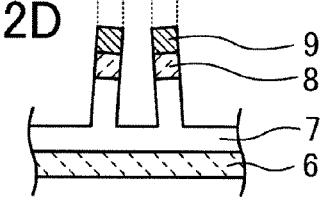

When a portion of the TiN film 9 corresponding to such a portion of the semiconductor device configured as above has low compressive stress, the separation portion 20b is formed normally as illustrated in FIGS. 32A and 32C. However, when the TiN film 9 has high compressive stress, portions of the TiN film 9 corresponding to the separation portions 20a and 20c significantly expand upward and downward in FIG. 32B, i.e., in directions of extension of the portions 14a and 14c of the interconnect groove 14 which are indicated by arrows 22S, as illustrated in FIGS. 32B and 32D to reduce the compressive stress. Due to the influence of such expansion, as indicated by an arrow 22T, the separation portion 20b is deformed toward the inside of the portion 14b of the interconnect groove 14, and thus, the size of the portion 14b of the interconnect groove 14 is reduced so that the size of the finished portion 14b of the interconnect groove 14 is smaller than a set size. This causes poor filling of the interconnect grooves 14 and the via hole 15 with the Cu film 17 in the process step in FIG. 29C, and consequently, the yield and reliability of the semiconductor device decrease.

Figure 33A:
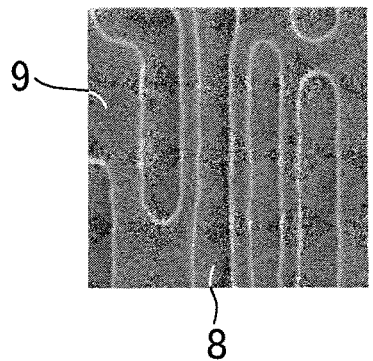
FIGS. 33A and 33B are diagrams illustrating results obtained by observing the surface of a semiconductor substrate in the process steps in FIGS. 28B and 29B, respectively, by using a scanning electron microscope (SEM)

FIGS. 33A-35B illustrate examples in which the above problems were actually verified. FIGS. 33A and 33B illustrate results obtained by observing the surface of the semiconductor substrate in the process steps in FIGS. 28B and 29B, respectively, by a scanning electron microscope (SEM). FIG. 33C is an enlarged view of a region 23r in FIG. 33B. As illustrated in FIG. 33A, in an SEM image observed in the process step in FIG. 28B, end portions of the shapes of elements (portions of the image looking white) have a substantially fixed thickness. In contrast, as illustrated in FIGS. 33B and 33C, in an SEM image observed in the process step in FIG. 29B, the width of an end portion of a separation portion 20 of the TiN film 9 in the specific region 23r (the width of the portion of each of the images looking white) increases.

Figure 33B:
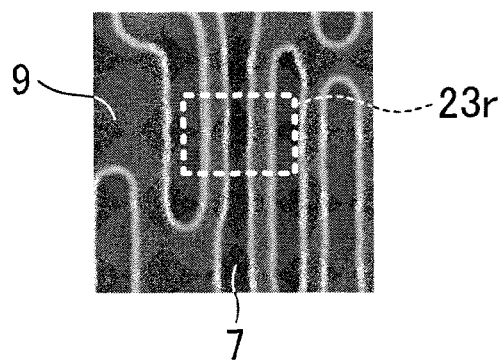
Figure 33C:
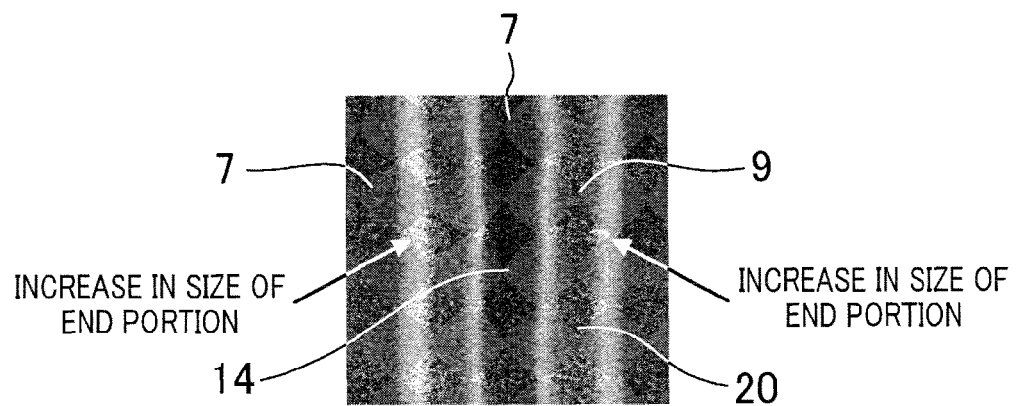
FIG. 33C is an enlarged view of FIG. 33B.
Figure 34:
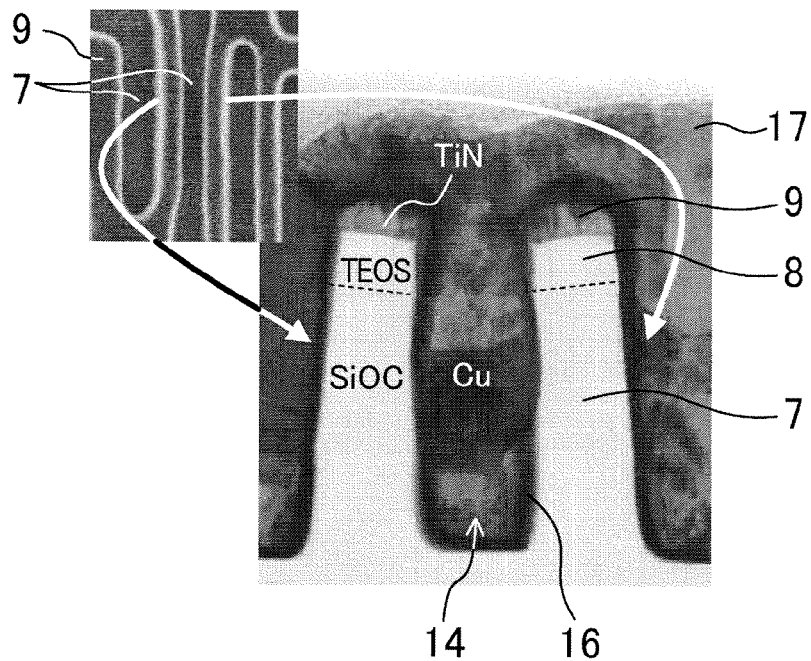
FIG. 34 is a TEM image illustrating a cross section of an observed region corresponding to FIG. 33B in the process step in FIG. 29C.

FIG. 34 illustrates a transmission electron microscope (TEM) image of an observed cross section of a region corresponding to the region illustrated in FIG. 33B in the process step in FIG. 29C in order to investigate the reason why the width of the end portion increases as observed in FIG. 33B. As seen from FIG. 34, the separation portion 20b is deformed due to the compressive stress of the TiN film 9 so as to be inclined inward. The reason why the width of the end portion increases as observed in FIG. 33B is that the deformation of the separation portion 20b facilitates observing the sidewall of the interconnect groove 14 from above.

Figure 35A:
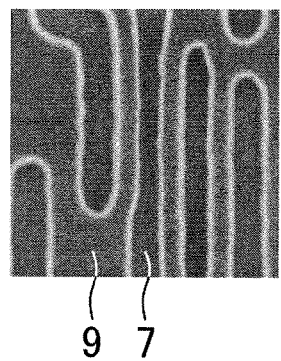
FIGS. 35A and 35B are SEM images illustrating the observed region corresponding to FIG. 33B in the process step in FIG. 30.
Figure 35B:
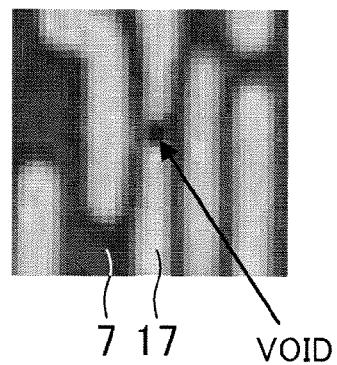

FIGS. 35A and 35B illustrate SEM images of an observed region corresponding to the region illustrated in FIG. 33B in the process steps in FIGS. 29B and 30, respectively. As seen from FIG. 35B, poor filling of a portion of an interconnect groove 14 adjacent to a deformed portion of the separation portion 20b with the Cu film 17 occurs, thereby forming a void.

Furthermore, the inventors of this application examined a semiconductor device being fabricated in detail, and studied the conditions where poor filling of the interconnect groove 14 with the Cu film 17 occurs. First, poor filling of the interconnect groove 14 with the Cu film 17 occurred in a situation where a structure obtained by sequentially stacking a SiOC film having a relative dielectric constant k of 2.5 and a SiOC film having a relative dielectric constant k of 3.0 was used as the SiOC film 7. On the other hand, such poor filling did not occur in a situation where a single-layer SiOC film having a relative dielectric constant k of 3.0 was used as the SiOC film 7. The reason for this is as follows: while the Young's modulus of the SiOC film having a relative dielectric constant k of 2.5 is 8 MPa, the Young's modulus of the SiOC film having a relative dielectric constant k of 3.0 is 20 MPa; and the former is more easily deformed than the latter. In other words, poor filling of the interconnect groove 14 with the Cu film 17 occurs with a reduction in the dielectric constant of the SiOC film.

Figure 36:
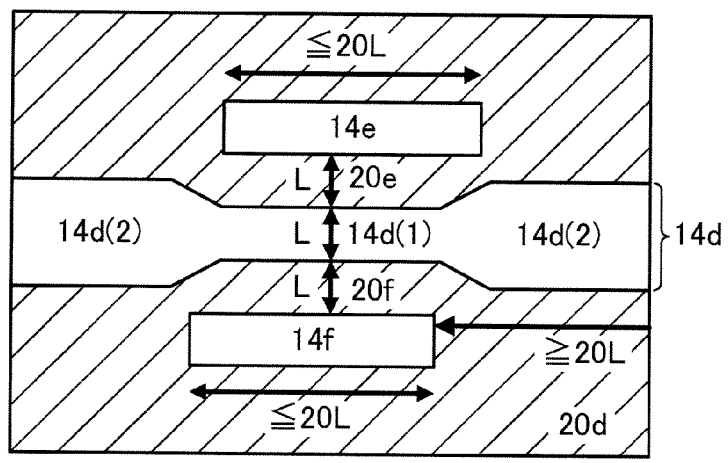
FIG. 36 is a diagram illustrating a structure in which poor filling tends to occur.

Furthermore, as clear from a comparison between FIGS. 35A and 35B, after the process step in FIG. 30, poor filling of the interconnect groove 14 with the Cu film 17, i.e., a void, occurred. Closer studies of the poor filling revealed that poor filling of the interconnect groove 14 with the Cu film 17 occurred in a region having such a structure as illustrated in FIG. 36 after the process step in FIG. 29B. The structure illustrated in FIG. 36 includes an interconnect groove 14d having a portion 14d(1) designed to have a minimum width (L) under design rules, and portions 14d(2) having a width greater than the width of the portion 14d(1) of the interconnect groove 14, interconnect grooves 14e and 14f located a distance L apart from the portion 14d(1) of the interconnect groove 14 with the portion 14d(1) of the interconnect groove 14 interposed therebetween, and a separation portion 20d of an insulating film adjacent to the interconnect groove 14e or 14f, and having a length of 20 L or greater in a direction parallel to the direction of extension of the interconnect groove 14d. The reason why poor filling occurs in such a structure is that the separation portion 20d expands in the direction parallel to the direction of extension of the interconnect groove 14d to deform a separation portion 20e of the insulating film between the portion 14d(1) and the interconnect groove 14e or a separation portion 20f thereof between the portion 14d(1) and the interconnect groove 14f.

It was found that as illustrated in FIG. 36, poor filling tends to occur, in particular, in a situation where the lengths of the interconnect grooves 14e and 14f are equal to or less than 20 L. The reason for this is that the radius of curvature of each of the separation portion 20e and 20f increases, and stress is highly concentrated in the separation portions 20e and 20f, resulting in an increase in the degree of deformation of each of the separation portions 20e and 20f.

However, in the structure of a semiconductor device in which the minimum width (L) under design rules is greater than 60 nm, poor filling of the interconnect groove 14d with the Cu film 17 does not occur, and in the structure of a semiconductor device in which the minimum width (L) under design rules is equal to or less than 60 nm, poor filling of the interconnect groove 14d with the Cu film 17 occurs. For this reason, with a decrease in the width L, the influence of the deformation of the separation portion 20e or 20f becomes significant, and it becomes difficult to fill portions of the interconnect groove 14d with the Cu film 17. Therefore, miniaturization of semiconductor devices causes poorer filling of a portion of an interconnect groove with a Cu film.

Figure 37A:
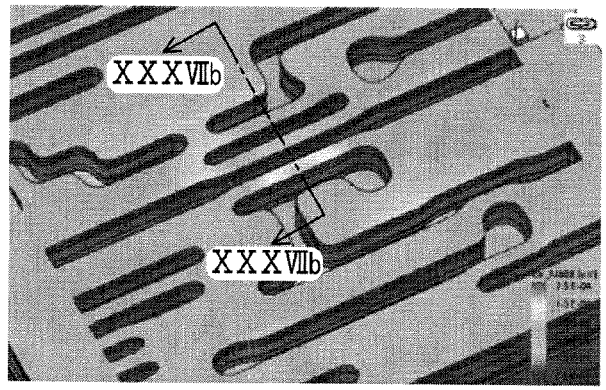
Figure 37B:
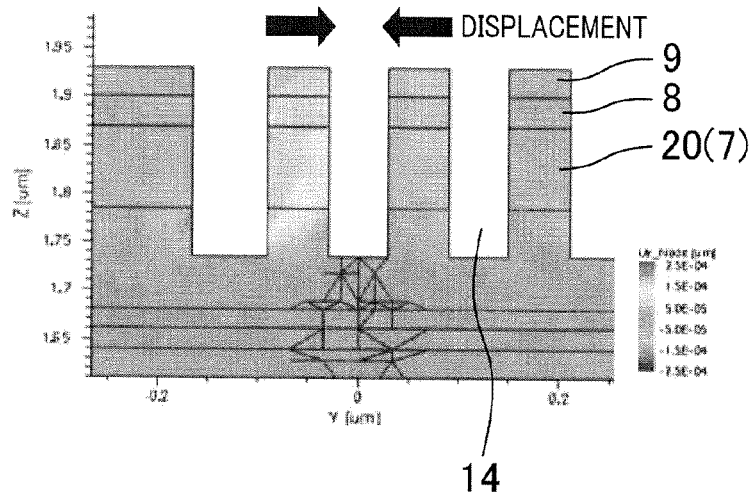

It has been recognized that such a problem of poor filling due to the deformation of a separation portion is replicated also by a stress simulation. FIGS. 37A and 37B illustrate stress simulation conditions and results in the process step in FIG. 29B. As seen from FIGS. 37A and 37B, the phenomenon in which two central separation portions 20 are deformed due to the compressive stress of the TiN film 9 to reduce the size of the interconnect groove 14 between the central separation portions 20 is replicated. The degree of deformation corresponds to variations in display color arising from stress application. In stress simulations of any shape, this phenomenon can be replicated by appropriately adjusting simulation conditions.

A semiconductor device fabrication method which is less likely to cause poor filling and is based on these studied results will be described in embodiments. The following embodiments are intended to clearly illustrate the technical idea of the present disclosure with reference to the attached drawings and the detailed description, and persons skilled in the technical field could make modifications and additions to the technical idea of the present disclosure after understanding preferred examples of the present disclosure. These modifications and additions do not depart from the technical idea and scope of the disclosure.

First Embodiment

A method for fabricating a semiconductor device according to a first embodiment will be described hereinafter with reference to the drawings.

Figure 1A:
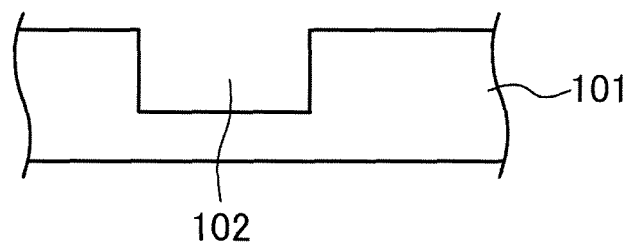
FIGS. 1A-1C are cross-sectional views illustrating process steps in a method for fabricating a semiconductor device according to a first embodiment.

First, as illustrated in FIG. 1A, an insulating film 101 is deposited on the surface of a semiconductor substrate (not shown), and then, an interconnect groove 102 is formed in the insulating film 101 by photolithography and dry etching.

Figure 1B:
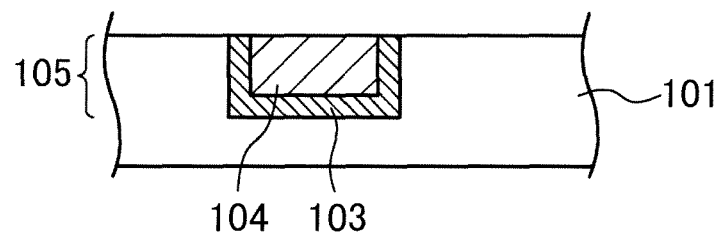

Next, as illustrated in FIG. 1B, a barrier film 103 and a copper (Cu) film 104 are sequentially deposited to cover the surface of the insulating film 101 and fill the interior of the interconnect groove 102, and then, a portion of the barrier film 103 and a portion of the Cu film 104 which are located outside the interconnect groove 102 are removed by CMP. Thus, a lower interconnect 105 including a portion of the barrier film 103 and a portion of the Cu film 104 both in the interior of the interconnect groove 102 is formed.

Figure 1C:
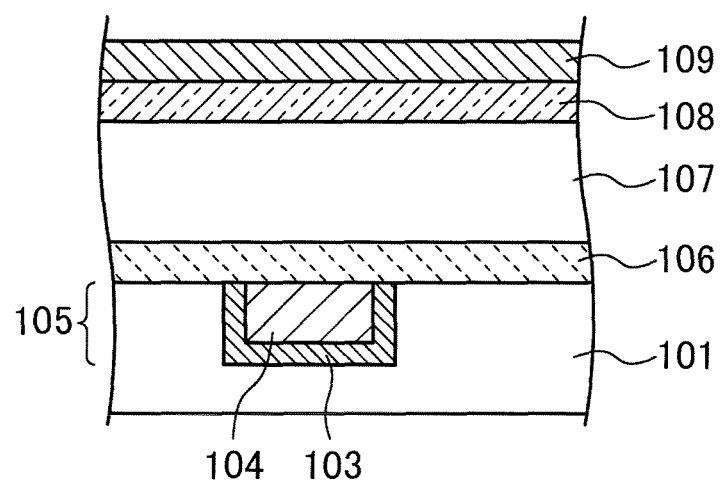

Next, as illustrated in FIG. 1C, a silicon carbide (SiC) film 106, a silicon oxycarbide (SiOC) film 107, a silicon dioxide (SiO$_2$) film 108, and a metal film 109 are sequentially deposited, as a lower interlayer insulating film, an upper interlayer insulating film, a lower hard mask formation film, and an upper hard mask formation film, respectively, on the surface of the insulating film 101 and the surface of the lower interconnect 105. In this embodiment, a film obtained by sequentially stacking a silicon carbide nitride (SiCN) film and a silicon carbide oxide (SiCO) film is used as the SiC film 106. Furthermore, a film obtained by sequentially stacking a SiOC film having a relative dielectric constant k of 2.5 and a SiOC film having a relative dielectric constant k of 3.0 is used as the SiOC film 107. The relative dielectric constant k of each of the films forming the SiOC film 107 corresponds to the previously described conditions where poor filling of an interconnect groove with a Cu film occurs. A TiN film having a compressive stress of 600 MPa is used as the metal film 109 serving as the hard mask formation film. Preferable features of the metal film 109 will be described in detail below.

Next, as illustrated in FIG. 2A, a resist 110 is deposited on the surface of the metal film 109, and then, interconnect groove patterns 111 are transferred to the resist 110 by lithography. In this embodiment, a two-layer resist including a lower bottom anti reflection coating (BARC) and an upper resist is used as the resist 110. The minimum width of each of the interconnect groove patterns 111 and the minimum spacing between an adjacent pair of the interconnect groove patterns 111 are set at 60 nm.

Next, as illustrated in FIG. 2B, the metal film 109 is etched using the resist 110 as a mask, and then, the resist 110 is removed.

Next, as illustrated in FIG. 2C, a resist 112 is deposited to cover the surfaces of the SiO$_2$ film 108 and metal film 109, and then, a via pattern 113 is transferred to the resist 112 by lithography. In this embodiment, a three-layer resist including a lower resist, a SiO$_2$ film, and an upper resist is used as the resist 112.

Figure 3A:
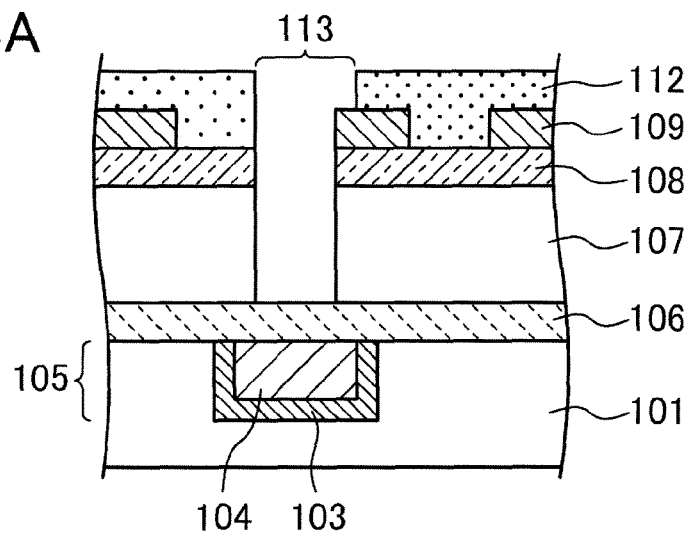
FIGS. 3A-3C are cross-sectional views illustrating process steps in the method for fabricating a semiconductor device according to the first embodiment.
Figure 3B:
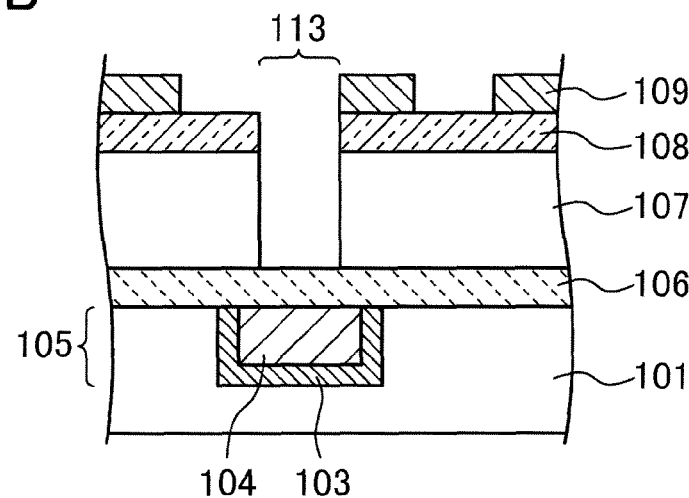

Next, as illustrated in FIG. 3A, the SiO$_2$ film 108 and the SiOC film 107 are etched using the resist 112 as a mask, and then, as illustrated in FIG. 3B, the resist 112 is removed.

Figure 3C:
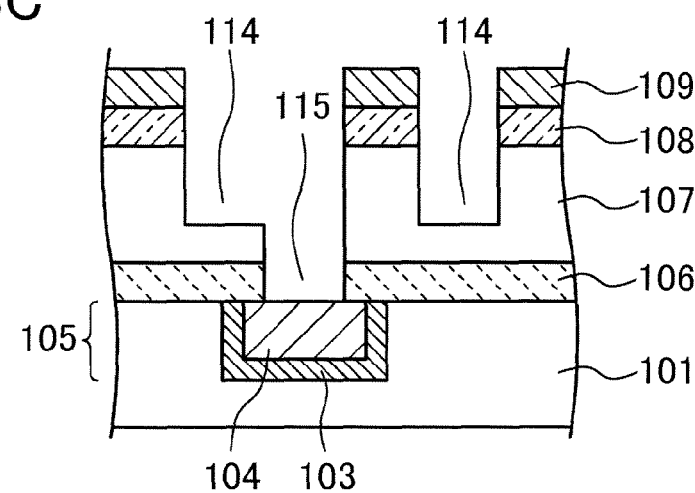

Next, as illustrated in FIG. 3C, the SiO$_2$ film 108, the SiOC film 107, and the SiC film 106 are etched using the patterned metal film 109 as a hard mask to form interconnect grooves 114 and a via hole 115.

Figure 4A:
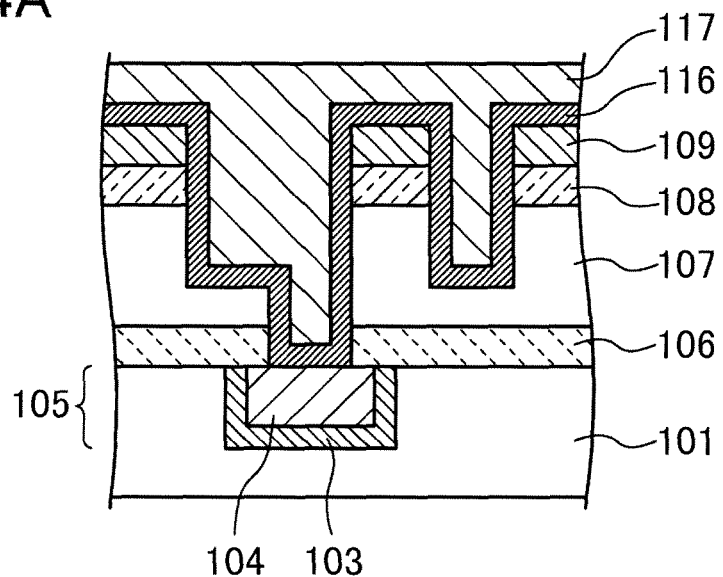
FIGS. 4A and 4B are cross-sectional views illustrating process steps in the method for fabricating a semiconductor device according to the first embodiment.

Next, as illustrated in FIG. 4A, a barrier film 116 and a Cu film 117 are sequentially deposited to cover the surface of the metal film 109 and fill the interiors of the interconnect grooves 114 and the interior of the via hole 115.

Figure 4B:
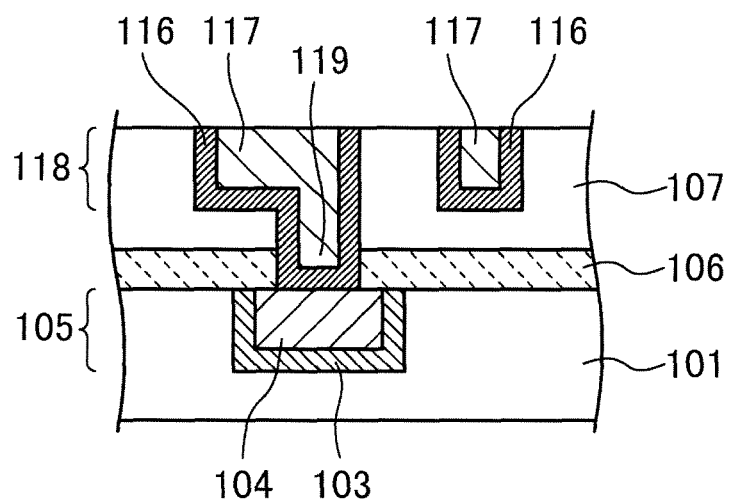

Next, as illustrated in FIG. 4B, a portion of the Cu film 117 and a portion of the barrier film 116 which are located outside each of the interconnect grooves 114, the metal film 109, and the SiO$_2$ film 108 are removed by CMP. Thus, upper interconnects 118 each including a portion of the barrier film 116 and a portion of the Cu film 117 both in a corresponding one of the interconnect grooves 114, and a via 119 including a portion of the barrier film 116 and a portion of the Cu film 117 both in the via hole 115 are formed.

The metal film 109 which is a hard mask formation film deposited in the process step in FIG. 1C will be described hereinafter in detail. As previously described, in the conventional method for fabricating a semiconductor device, the TiN film serving as a hard mask has a very high compressive stress (about −1400 MPa), and may significantly affect, e.g., pattern formation in a process for fabricating a semiconductor device. To address this problem, the influence of the stress of the metal film 109 in the method for fabricating a semiconductor device according to this embodiment was first studied.

Figure 5A:
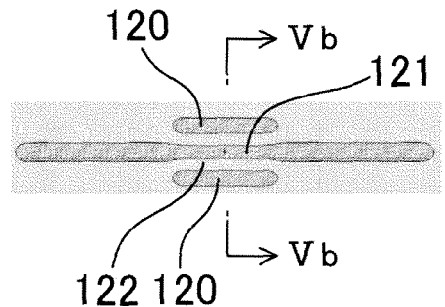
Figure 5B:
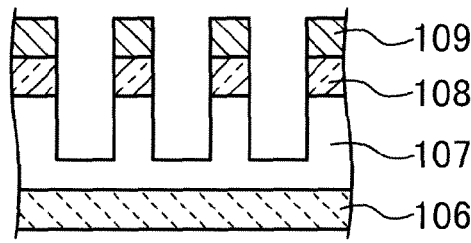

The influence of the stress of the metal film 109 was studied using the structure illustrated in FIGS. 5A and 5B. As illustrated in FIGS. 5A and 5B, a central interconnect groove 121 having a relatively long length in the direction of extension of interconnect grooves is disposed between two interconnect grooves 120 having a relatively short length in the direction of extension of the interconnect grooves, the two interconnect grooves 120 are disposed with a separation portion 122 (including a portion of the metal film 109, a portion of the SiO$_2$ film 108, and a portion of the SiOC film 107) interposed therebetween. The reason why the influence was studied using a region with the structure illustrated in FIGS. 5A and 5B is that poor filling of an interconnect groove with a Cu film due to the deformation of the separation portion occurs in a region of a semiconductor device having such a structure as illustrated in FIGS. 32A-35B and a region of a semiconductor device having the structure illustrated in FIG. 36.

The inventors' studies revealed that problems of, e.g., poor filling of an interconnect groove with a Cu film in the conventional method for fabricating a semiconductor device can be solved by setting the stress of the metal film 109 to fall within a range of −1000 MPa to 0 Pa (a compressive stress range greater than or equal to 0 Pa and equal to or less than 1000 MPa).

Figure 6:
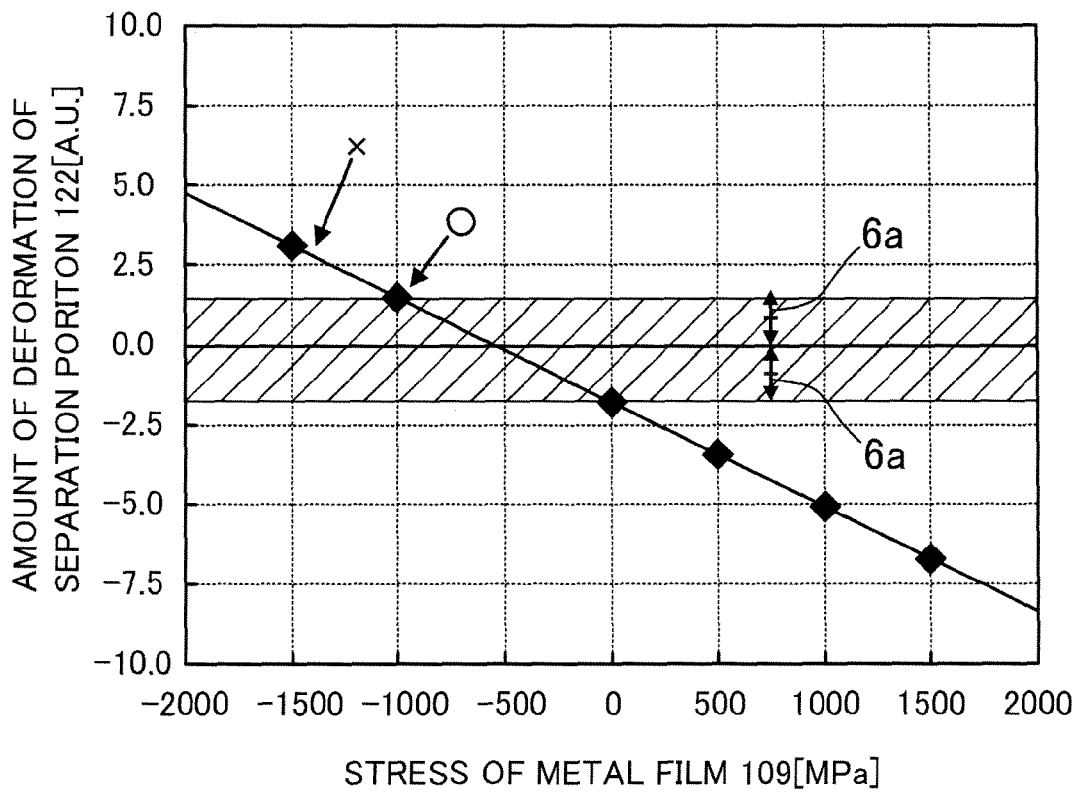
FIG. 6 is a graph illustrating the relationship between stress and the amount of deformation of a separation portion in the semiconductor device according to the first embodiment.

FIG. 6 illustrates the relationship between the stress of the metal film 109 in this embodiment and the amount of deformation of the separation portion 122 illustrated in FIGS. 5A and 5B. FIG. 6 shows that a linear relationship exists between the stress of the metal film 109 and the amount of deformation of the separation portion 122. Separately, the relationship between the stress of the metal film 109 and poor filling of an interconnect groove with a Cu film was examined, and in this examination, poor filling of the interior of the interconnect groove with the Cu film was recognized (as illustrated by the symbol x in FIG. 6) under a compressive stress of 1400 MPa. In contrast, under a compressive stress of 1000 MPa, poor filling of the interior of the interconnect groove with the Cu film was not recognized (as illustrated by the symbol ○ in FIG. 6). For this reason, it is assumed that when the compressive stress is equal to or less than 1000 MPa, the amount of deformation of the separation portion 122 further decreases, and thus, poor filling of the interior of the interconnect groove with the Cu film does not occur.

In contrast, it is assumed based on the mechanism n FIG. 6 that when the stress of the metal film 109 exceeds 0 Pa, and is converted into tensile stress, the separation portion 122 is deformed so as to be inclined in the opposite direction. In this case, in FIGS. 5A and 5B, poor filling of, not the interconnect groove 121, but the interiors of the interconnect grooves 120 occurs. There exists the relationship between the stress of the metal film 109 and the amount of deformation of the separation portion 122 as illustrated in FIG. 6, i.e., the relationship where poor filling of the interiors of the interconnect grooves 120 with the Cu film 117 does not occur as long as the stress of the metal film 109 is tensile stress deforming the separation portion 122 by the amount of deformation (deformation amount 6a) substantially equal to the amount of deformation of the separation portion 122 which, when the stress of the metal film 109 is compressive stress, does not cause poor filling of the interior of the interconnect groove 121 with the Cu film 117. Therefore, such poor filling is predicted to occur when the stress of the metal film 109 exceeds 0 Pa, and is converted into tensile stress.

The above results show that, in order to prevent poor filling of interconnect grooves with the Cu film 117, the stress of the metal film 109 is preferably set within a compressive stress range of greater than or equal to 0 Pa and equal to or less than 1000 MPa.

More preferably, the stress of the metal film 109 may be appropriately set so that the amount of deformation of the separation portion 122 is zero. The examples in FIGS. 5A, 5B, and 6 show that the amount of deformation of the separation portion 122 can be zero, e.g., by setting the compressive stress of the metal film 109 at a compressive stress slightly greater than 500 MPa. In view of this point, in this embodiment, a TiN film having a compressive stress of 600 MPa is used as the metal film 109. The reason why the compressive stress of the metal film 109 allowing the amount of deformation of the separation portion 122 to be zero is not 0 Pa is that the stresses of the SiOC film 107 and the SiO$_2$ film 108 also affect the deformation of the separation portion 122.

Next, the preferable thickness of the metal film 109 will be described in detail. The metal film 109 is a film serving as a main body of a mask for use in etching in the process step in FIG. 3C. Here, in order to obtain a preferable shape of each of the finished interconnect grooves 114, the thickness of the metal film 109 is preferably set within a range of greater than or equal to 10 nm and equal to or less than 50 nm. The reason for this is as follows: when the thickness of the metal film 109 is less than 10 nm, the metal film 109 is significantly deformed with the etching in the process step in FIG. 3C to cause problems, such as a problem where the width of each of the interconnect grooves 114 abnormally increases; and when the thickness of the metal film 109 is greater than 50 nm, problems, such as a problem where the interconnect grooves 114 cannot be fully filled with the Cu film 117 in the process step in FIG. 4A, or a problem where the metal film 109 cannot be completely removed in the process step in FIG. 4B, occur.

Figure 7:
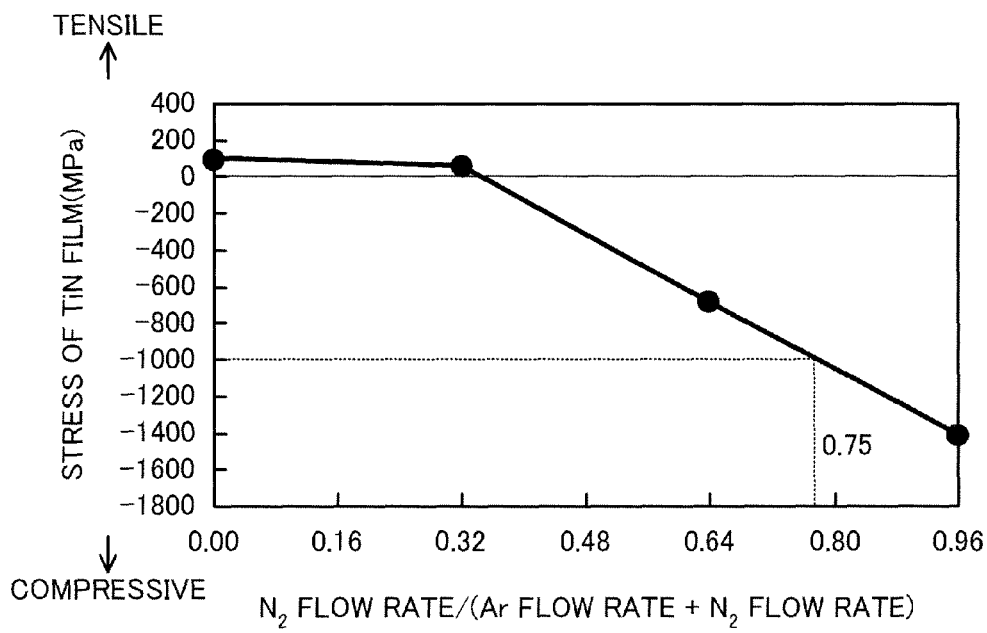
FIG. 7 is a graph illustrating the relationship between the flow rate of N$_2$ and stress in the formation of a TiN film in the method for fabricating a semiconductor device according to the first embodiment.

Next, a process for depositing the metal film 109 will be described in detail. A result of examination using the flow rate of nitrogen ($N_2$) in the formation of the metal film 109 as a parameter will be described as a first example. FIG. 7 illustrates a result obtained by investigating the relationship between the $N_2$ mole fraction (=$N_2$ flow rate/(Ar flow rate+$N_2$ flow rate)) at which a TiN film is deposited by reactive physical vapor deposition (PVD), such as reactive sputtering, and the stress of the TiN film FIG. 7 shows that when the $N_2$ mole fraction is equal to or less than 0.75, the compressive stress of the TiN film is a preferable value, i.e., 1000 MPa or less. Therefore, a TiN film is preferably deposited, as the metal film 109, at an $N_2$ mole fraction equal to or less than 0.75 by reactive PVD. In this embodiment, the TiN film having a compressive stress of 600 MPa is deposited by reactive PVD. The reason why the stress of the TiN film decreases with a reduction in the $N_2$ mole fraction is that a reduction in the amount of N contained in the TiN film allows the quality of the TiN film to be closer to the quality of a Ti film.

As illustrated in FIG. 7, when the $N_2$ mole fraction is less than 0.35, the compressive stress of the TiN film is less than 0 Pa, and thus, the TiN film is preferably deposited, as the metal film 109, at an $N_2$ mole fraction greater than or equal to 0.35 and equal to or less than 0.75 by reactive PVD.

Figure 8:
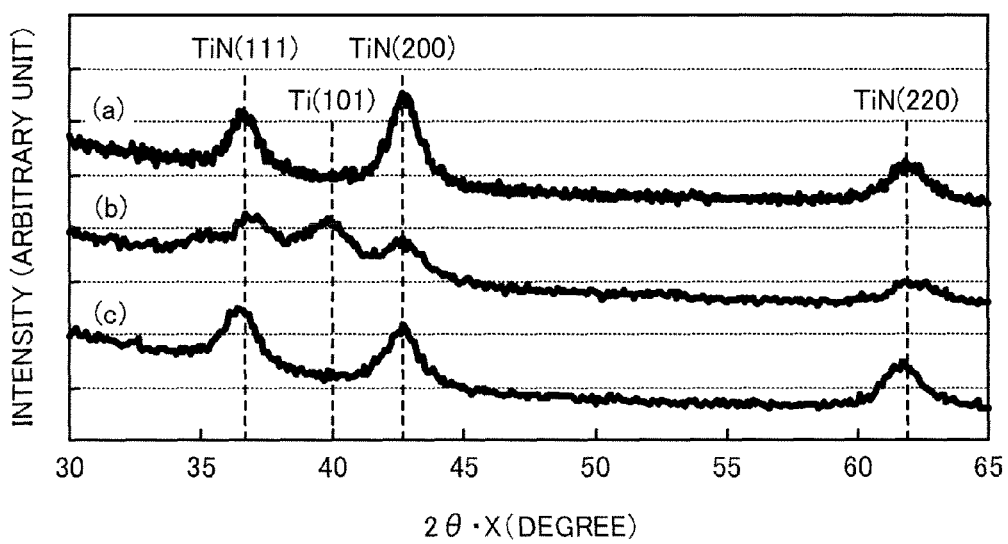
FIG. 8 is a graph illustrating results obtained by determining, by X-ray diffraction (XRD), the crystallinity of the TiN film deposited by physical vapor deposition (PVD).

A result obtained by examining the quality of the TiN film formed as above will be described hereinafter. FIG. 8 illustrates results obtained by estimating crystallinity by x-ray diffraction (XRD). In FIG. 8, the line (a) illustrates the crystallinity of the TiN film deposited at an $N_2$ mole fraction of 0.96, and the line (b) illustrates the crystallinity of the TiN film deposited at an $N_2$ mole fraction of 0.64. As illustrated in FIG. 8, when the $N_2$ mole fraction is 0.96, the TiN film is preferentially oriented in a TiN (200) plane. In contrast, when the $N_2$ mole fraction is 0.64, the TiN film is preferentially oriented in a Ti (101) plane, thereby showing that the quality of the TiN film is close to that of a Ti film.

FIGS. 9A-9F illustrate results obtained by observing the shape of the TiN film by TEM. As illustrated in FIGS. 9A and 9D, the TiN film formed at an $N_2$ mole fraction of 0.96 has a generally observed structure including large crystal grains. In contrast, as illustrated in FIGS. 9B and 9E, the TiN film formed at an $N_2$ mole fraction of 0.64 has a structure including very small crystal grains.

Figure 10:
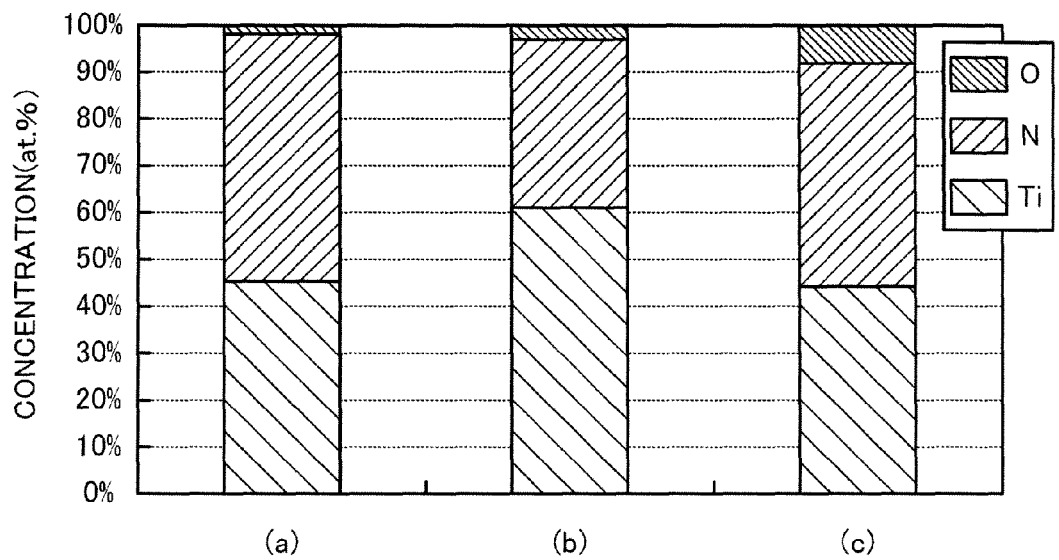
FIG. 10 is a graph illustrating results obtained by estimating, by X-ray photoelectron spectroscopy (XPS), the concentrations of elements in the TiN film deposited by PVD.

FIG. 10 illustrates results obtained by measuring the concentrations of elements in the film by x-ray photoelectron spectroscopy (XPS). In FIG. 10, the TiN film illustrated by the bar (a) and formed at an $N_2$ mole fraction of 0.96 has a Ti to N ratio of about 1:1, and forms an intermetallic compound. In contrast, in FIG. 10, the TiN film illustrated by the bar (b)

and formed at an $N_2$ mole fraction of 0.64 has a high ratio of Ti to N, and forms a Ti-rich film.

Figure 11:
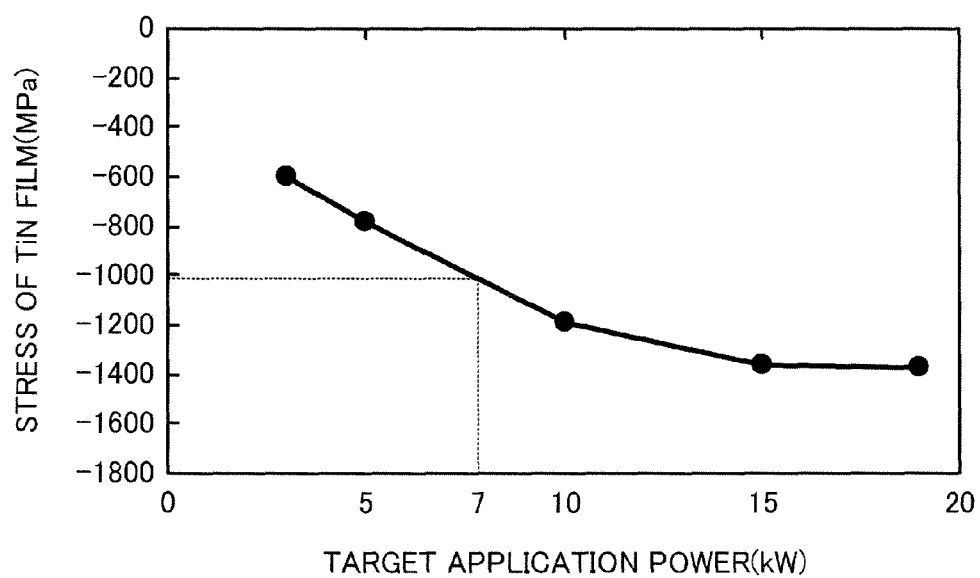
FIG. 11 is a graph illustrating the relationship between a target application voltage and stress in the formation of the TiN film in the method for fabricating a semiconductor device according to the first embodiment.

Next, a result of examination using the target application power to be applied to a target in the formation of the metal film 109 as a parameter will be described. FIG. 11 illustrates the relationship between the target application power for depositing a TiN film by reactive PVD and the stress of the TiN film. FIG. 11 shows that when the target application power is equal to or less than 7 kW, the compressive stress of the TiN film is a preferable value, i.e., 1000 MPa or less. Therefore, the metal film 109 made of the TiN film is preferably deposited at a target application power equal to or less than 7 kW by reactive PVD. In this embodiment, the target application power is set at 3 kW, and the TiN film having a compressive stress of 600 MPa is deposited by reactive PVD. The reason why the stress of the TiN film decreases with a decrease in the target application power is that with a reduction in the energy of each of TiN grains flying toward the surface of the semiconductor substrate, the grain size of the deposited TiN film decreases.

When the target application power is set at an excessively low target application power, the speed of the formation of the TiN film significantly decreases, thereby increasing the fabrication cost of a semiconductor device. Furthermore, since the grain size of the TiN film decreases, and the surface area of a crystal grain boundary increases, the TiN film consequently tends to absorb oxygen, moisture, and other elements. Therefore, when the semiconductor substrate is heated in a subsequent process step, the absorbed oxygen, moisture, and other elements are released, thereby reducing the controllability of later process steps. In view of the above points, the target application power is preferably set at a power greater than or equal to 0.5 kW.

A specific example of the quality of the obtained TiN film will be described hereinafter. In FIG. 8, the line (a) illustrates a result obtained by measuring the TiN film formed at a target application power of 19 kW by XRD, and the line (c) illustrates a result obtained by measuring the TiN film formed at a target application power of 3 kW by XRD. As illustrated in FIG. 8, it is clear that the TiN film formed at a target application power of 3 kW has a lower peak intensity and a lower degree of crystallinity than the TiN film formed at a target application power of 19 kW. The crystal structure of the TiN film formed at a target application power of 3 kW has needle-shaped crystals as illustrated in FIGS. 9C and 9F. In FIG. 10, the bar (a) illustrates a result obtained by measuring the TiN film formed at a target application power of 19 kW by XPS, and the bar (c) illustrates a result obtained by measuring the TiN film formed at a target application power of 3 kW by XPS. As illustrated in FIG. 10, the TiN film formed at a target application power of 3 kW has a Ti to N ratio of about 1:1. While the Ti to N ratio is substantially identical with that of the TiN film formed at a target application power of 19 kW, the oxygen concentration in the TiN film formed at a target application power of 3 kW is higher than that in the TiN film formed at a target application power of 19 kW. The reason for this is that since the grain size of the TiN film has decreased, and the surface area of a crystal grain boundary has increased, the TiN film has absorbed oxygen. However, in this case, the amount of the absorbed oxygen is not large enough to affect the controllability of each of the process step for forming a TiN film and the subsequent process steps. When the TiN film is formed at a target application power of 3 kW, the $N_2$ mole fraction is set at 0.96.

A TiN film having a compressive stress greater than or equal to 0 Pa and equal to or less than 1000 MPa can be deposited by using, e.g., reactive PVD in which the internal pressure of a chamber is set at a pressure greater than or equal to 15 mTorr (about 2 Pa) and equal to or less than 150 mTorr (about 20 Pa), reactive PVD in which the deposition temperature is set at a temperature greater than or equal to 25° C. and equal to or less than 200° C., or chemical vapor deposition (CVD) or atomic layer deposition (ALD) using an organic metallic compound, other than the above-described two deposition conditions, as a process for depositing a metal film 109.

Next, preferable features of the hard mask etching illustrated in FIG. 2B will be described in detail. When a $SiO_2$ film 108 is deposited between a SiOC film 107 and a metal film 109 as in this embodiment, the hard mask etching is preferably completed with exposure of the $SiO_2$ film 108. The reason for this is that when exposure of the SiOC film 107 is prevented also after the process step in FIG. 2B, this enables use of widely used oxygen ($O_2$) plasma treatment as an ashing process in removing the resist 110.

A $SiO_2$ film 108 may not be deposited between a SiOC film 107 and a metal film 109; however, in this case, the hard mask etching is preferably immediately completed with exposure of the SiOC film 107, and the resist 110 is preferably removed using a gas system preventing alteration of the SiOC film 107 (such as a He gas or a $H_2$ gas).

Next, a preferable feature of the via hole etching illustrated in FIG. 3A will be described in detail. In the via hole etching illustrated in FIG. 3A, not only the resist 112 but also the metal film 109 are preferably used as a mask. Thus, as illustrated in FIG. 3A, even when the via pattern 113 is partially outside the corresponding interconnect groove pattern 111 due to misalignment in lithography, the metal film 109 functions as a mask to minimize the influence of a portion of the via pattern 113 outside the corresponding interconnect groove pattern 111.

According to the semiconductor device fabrication method of this embodiment, the compressive stress of the metal film 109 can be set at a sufficiently low stress, thereby reducing such deformation of a separation portion as illustrated in FIGS. 31-34. In this embodiment, this reduction can prevent poor filling of an interconnect groove with a Cu film, which occurs, e.g., in the region illustrated in FIG. 35B. Consequently, the yield and reliability of the semiconductor device can be improved.

Second Embodiment

In the first embodiment, an example in which a single-layer metal film 109 is used was described; however, in a second embodiment, a multilayer film of a metal film 123 and a metal film 124 is used. The other configurations are similar to those in the first embodiment.

Figure 12A:
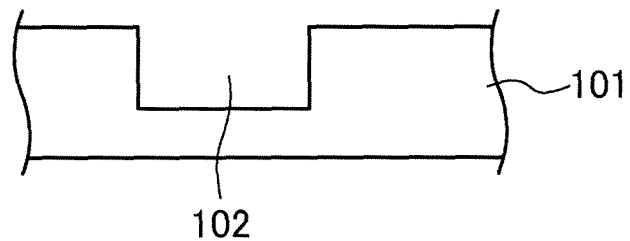
FIGS. 12A-12C are cross-sectional views illustrating process steps in a method for fabricating a semiconductor device according to a second embodiment.

In a method for fabricating a semiconductor device according to the second embodiment, as illustrated in FIG. 12A, an insulating film 101 is first deposited on the surface of a semiconductor substrate (not shown), and then, an interconnect groove 102 is formed in the insulating film 101 by photolithography and dry etching.

Figure 12B:
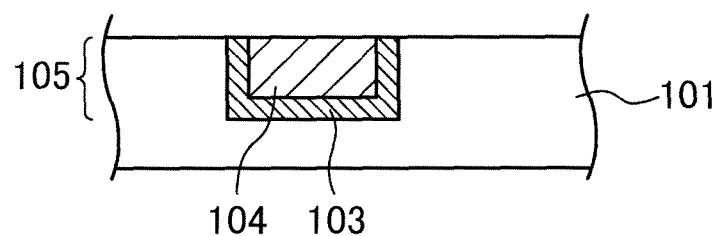

Next, as illustrated in FIG. 12B, a barrier film 103 and a Cu film 104 are sequentially deposited to cover the surface of the insulating film 101 and fill the interior of the interconnect groove 102, and then, a portion of the barrier film 103 and a portion of the Cu film 104 which are located outside the interconnect groove 102 are removed by CMP. Thus, a lower interconnect 105 including a portion of the barrier film 103 and a portion of the Cu film 104 both in the interior of the interconnect groove 102 is formed.

Figure 12C:
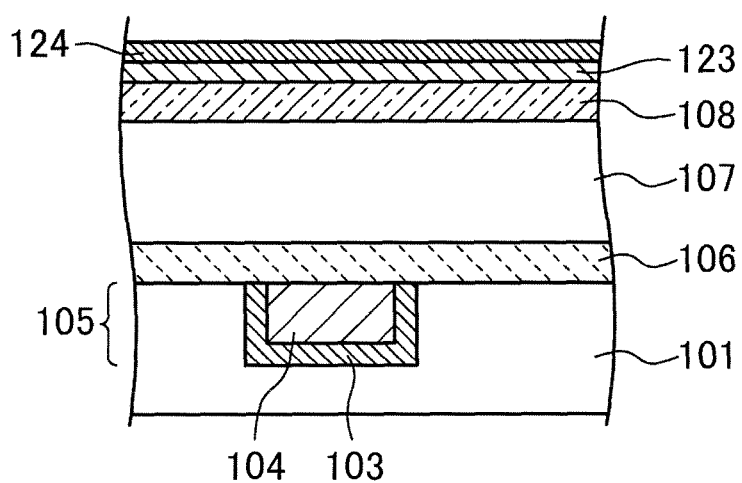

Next, as illustrated in FIG. 12C, a SiC film 106, a SiOC film 107, a SiO$_2$ film 108, a metal film 123 (a first hard mask formation film), and a metal film 124 (a second hard mask formation film) are sequentially deposited on the surface of the insulating film 101 and the surface of the lower interconnect 105. The SiC film 106 serves as a lower interlayer insulating film, the SiOC film 107 serves as an upper interlayer insulating film, the SiO$_2$ film 108 serves as a lower hard mask formation film, and a structure including the metal films 123 and 124 serves as an upper hard mask formation film. In this embodiment, a film obtained by sequentially stacking a SiCN film and a SiCO film is used as the SiC film 106. A film obtained by sequentially stacking a SiOC film having a relative dielectric constant k of 2.5 and a SiOC film having a relative dielectric constant k of 3.0 is used as the SiOC film 107. The reason why the SiOC film including the stacked films having the relative dielectric constants k as above is used is similar to that described in the first embodiment. Furthermore, a TiN film having a compressive stress of 600 MPa, a density of 4.4 g/cm$^3$, and a thickness of 20 nm is used as the metal film 123, and a TiN film having a compressive stress of 1400 MPa, a density of 4.9 g/cm$^3$, and a thickness of 10 nm is used as the metal film 124. As described below in detail, it is significant to set the compressive stress of the metal film 123 and the density of the metal film 124.

Figure 13A:
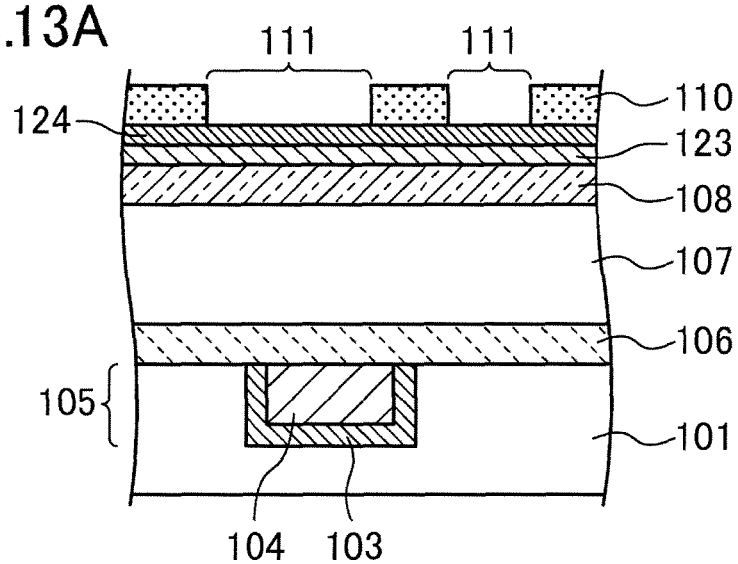
FIGS. 13A-13C are cross-sectional views illustrating process steps in the method for fabricating a semiconductor device according to the second embodiment.

Next, as illustrated in FIG. 13A, a resist 110 is deposited on the surface of the metal film 124, and then, interconnect groove patterns 111 are transferred to the resist 110 by lithography. In this embodiment, a two-layer resist including a lower BARC and an upper resist is used as the resist 110. The minimum width of each of the interconnect groove patterns 111 and the minimum spacing between an adjacent pair of the interconnect groove patterns 111 are set at 60 nm as design rules.

Figure 13B:
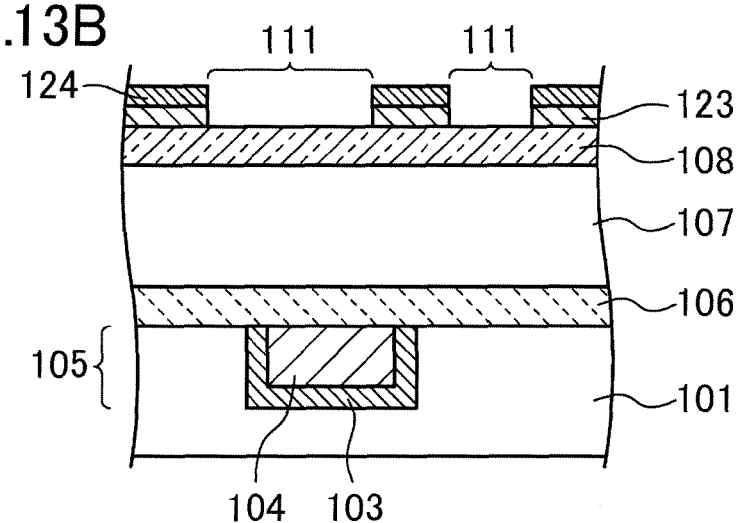

Next, as illustrated in FIG. 13B, the metal films 124 and 123 are etched using the resist 110 as a mask, and then, the resist 110 is removed.

Figure 13C:
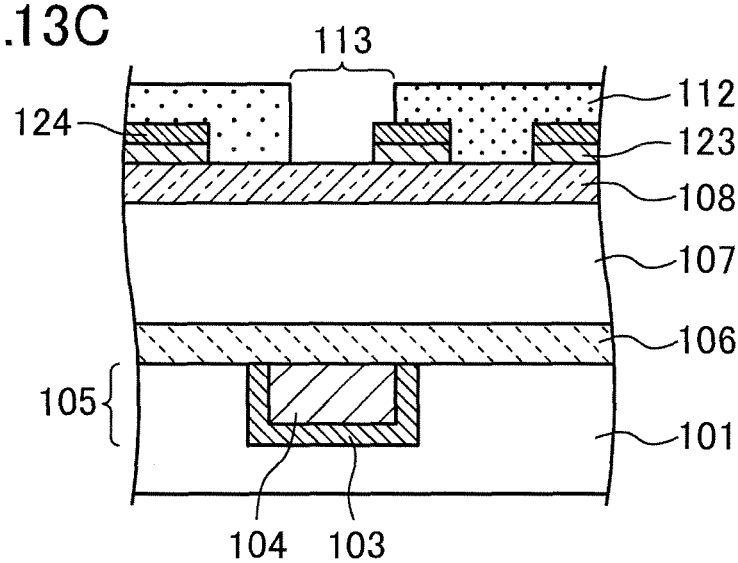

Next, as illustrated in FIG. 13C, a resist 112 is deposited to cover the surfaces of the SiO$_2$ film 108 and metal film 124, and then, a via pattern 113 is transferred to the resist 112 by lithography. In this embodiment, a three-layer resist including a lower resist, a SiO$_2$ film, and an upper resist is used as the resist 112.

Next, as illustrated in FIG. 14A, the SiO$_2$ film 108 and the SiOC film 107 are etched using the resist 112 as a mask, and then, as illustrated in FIG. 14B, the resist 112 is removed.

Next, as illustrated in FIG. 14C, the SiO$_2$ film 108, the SiOC film 107, and the SiC film 106 are etched using the metal films 123 and 124 as a mask to form interconnect grooves 114 and a via hole 115. With this etching, the thickness of the metal film 124 is reduced from 10 nm to 2 nm.

Figure 15A:
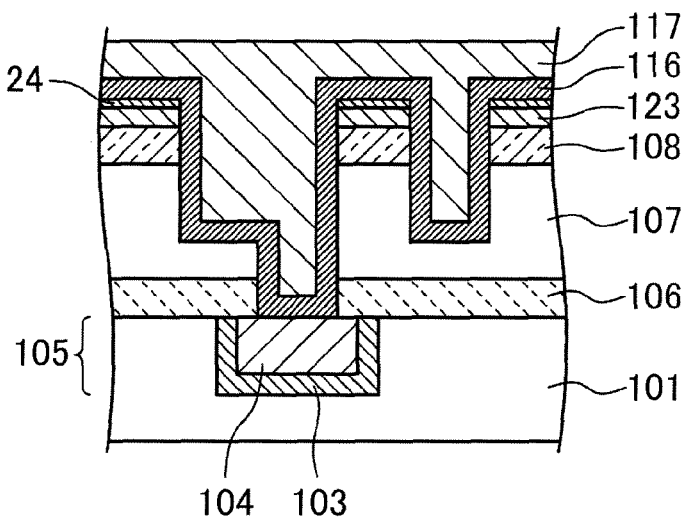
FIGS. 15A and 15B are cross-sectional views illustrating process steps in the method for fabricating a semiconductor device according to the second embodiment.

Next, as illustrated in FIG. 15A, a barrier film 116 and a Cu film 117 are sequentially deposited to cover the surface of the metal film 124 and fill the interiors of the interconnect grooves 114 and the interior of the via hole 115.

Figure 15B:
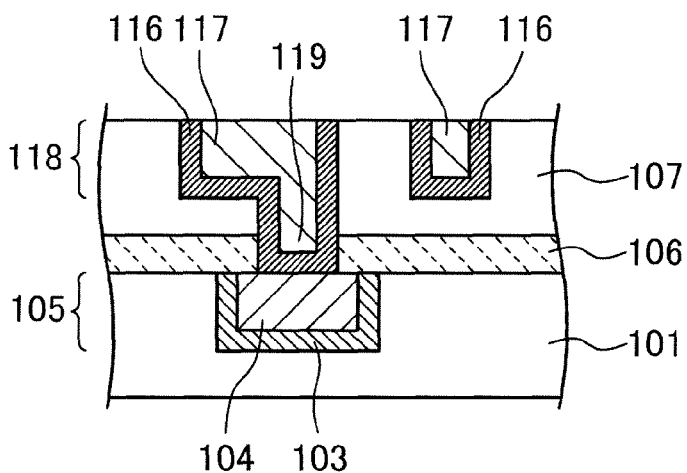

Next, as illustrated in FIG. 15B, a portion of the Cu film 117 and a portion of the barrier film 116 which are located outside the interconnect grooves 114, the metal films 124 and 123, and the SiO$_2$ film 108 are removed by CMP. Thus, upper interconnects 118 each including a portion of the barrier film 116 and a portion of the Cu film 117 both in a corresponding one of the interconnect grooves 114, and a via 119 including a portion of the barrier film 116 and a portion of the Cu film 117 both in the via hole 115 are formed.

The metal films 123 and 124 deposited in the process step in FIG. 12C will be described hereinafter in detail. In this embodiment, a multilayer film of the metal films 123 and 124 is used in the process step in FIG. 12C, thereby improving the dimensional accuracy of each of the interconnect groove patterns 111 to be formed in the process step in FIG. 13A.

Figure 16:
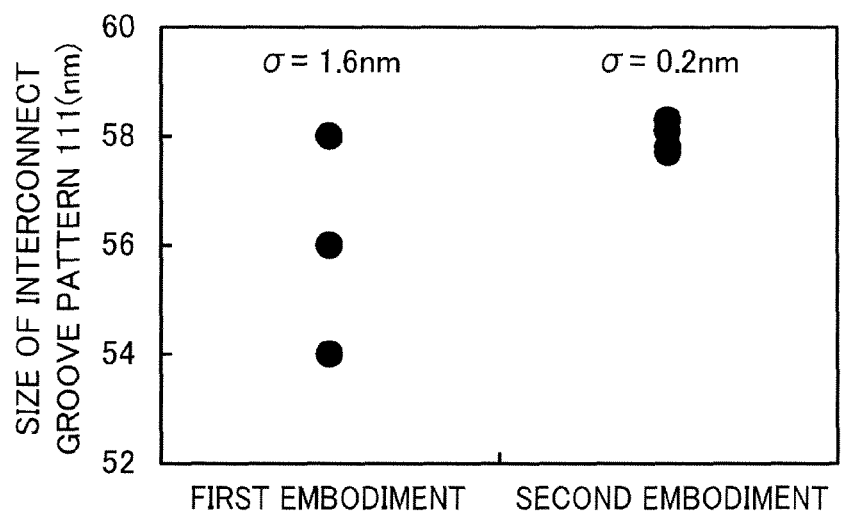
FIG. 16 is a diagram illustrating size variations among interconnect groove patterns in a semiconductor device according to each of the first and second embodiments.

FIG. 16 illustrates size variations among the interconnect groove patterns 111 in the first and second embodiments. FIG. 16 shows that while, in the first embodiment, the dimensional deviation ($\sigma$) of the interconnect groove patterns 111 is about 1.6 nm, the dimensional deviation ($\sigma$) of the interconnect groove patterns 111 is reduced to about 0.2 nm in the second embodiment.

The reason why such a result as illustrated in FIG. 16 is obtained is as follows. In the first embodiment, the resist 110 is deposited directly on the metal film 109. This causes diffusion of free ingredients (such as amine) in the interior of the metal film 109 made of a TiN film into the resist 110, resulting in a change in the properties of the resist 110 (e.g., deactivation of a chemically amplified resist). Therefore, the dimensional deviation of the interconnect groove patterns 111 increases. In contrast, in this embodiment, the metal film 124 having a higher density than the metal film 123 is deposited on the surface of the metal film 123, and thus, free ingredients in the interior of the metal film 123 are not diffused into the resist 110. This provides stable resist characteristics, thereby reducing the dimensional deviation of the interconnect groove patterns 111.

Next, preferable features of the metal film 123 will be described in detail. The metal film 123 is a film serving as a main body of a mask for use in etching in the process step in FIG. 14C. Here, in order to obtain a preferable shape of each of the finished interconnect grooves 114, the thickness of the metal film 123 is preferably set within a range of 10-50 nm. The reason for this is as follows: when the thickness of the metal film 123 is less than 10 nm, the metal film 123 is significantly deformed with the etching in the process step in FIG. 14C to cause problems, such as a problem where the width of each of the interconnect grooves 114 abnormally increases; and when the thickness of the metal film 123 is greater than 50 nm, problems, such as a problem where the interconnect grooves 114 cannot be fully filled with the Cu film 117 in the process step in FIG. 15A, or a problem where the metal film 123 cannot be completely removed in the process step in FIG. 15B, occur.

Furthermore, when the metal film 123 has high stress, the problem illustrated in FIGS. 31-34 occurs. Therefore, the compressive stress of the metal film 123 is preferably set in a manner similar to that in which the compressive stress of the metal film 109 in the first embodiment is set. The compressive stress of the metal film 123 is preferably set in a range of greater than or equal to 0 Pa and equal to or less than 1000 MPa, and is more preferably set at a compressive stress slightly greater than 500 MPa. In view of this point, in this embodiment, a TiN film having a compressive stress of 600 MPa is used as the metal film 123.

Next, preferable features of the metal film 124 will be described in detail. An object of the metal film 124 is to improve the dimensional accuracy of each of the interconnect groove patterns 111 in the process step in FIG. 13A by preventing diffusion of impurities or free ingredients from the metal film 123. Thus, the metal film 124 needs to have a denser structure than the metal film 123, i.e., to have a higher density than the metal film 123. Specifically, the metal film 124 preferably has a density of 4.5 g/cm$^3$. In view of the foregoing point, in this embodiment, a TiN film having a density of 4.9 g/cm$^3$ is used as the metal film 124. In many cases, a film with a high density has high stress, which causes the problem illustrated in FIGS. 31-34. Thus, it is not preferable that the metal film 124 has an excessively high density, and thus, the density of the metal film 124 is preferably set at a density greater than or equal to 4.5 g/cm$^3$ and equal to or less than 5.3 g/cm$^3$.

In many cases, a film with a high density generally has high stress. Thus, when the metal film 124 remaining after the process step in FIG. 13A is thick, the problem illustrated in FIGS. 31-34 occurs. To address this problem, in this embodiment, the thickness of the metal film 124 is set in a range of greater than or equal to 5 nm and equal to or less than 20 nm, and the metal film 124 remaining after the process step in FIG. 14C has a thickness equal to or less than 5 nm. The thickness of the remaining metal film 124 is preferably equal to or less than 5 nm, and the thickness of the metal film 124 to be deposited in the process step in FIG. 12C is preferably set such that the remaining metal film 124 has the closest possible thickness to 0 nm. In the process step in FIG. 14C, the metal film 124 is most preferably completely removed.

The reason why the thickness of the metal film 124 is set in a range of greater than or equal to 5 nm and equal to or less than 20 nm is as follows. When the thickness of the metal film 124 is less than 5 nm, it becomes difficult to prevent diffusion of impurities or free ingredients from the metal film 123. Furthermore, when the thickness of the metal film 124 is greater than 20 nm, it becomes difficult to control the thickness of the remaining metal film 124 after the process step in FIG. 14C such that the thickness is equal to or less than 5 nm. In this embodiment, the thickness of the metal film 124 is set at 10 nm, and the thickness of the remaining metal film 124 after the process step in FIG. 14C is, e.g., 2 nm.

Next, preferable compositions of the metal films 123 and 124 will be described in detail. The metal films 123 and 124 are preferably made of the same element. The reason for this is that when the metal films 123 and 124 are made of different elements, lithography in the process steps in FIGS. 13A and 13C is to be performed under complicated conditions.

Figure 17:
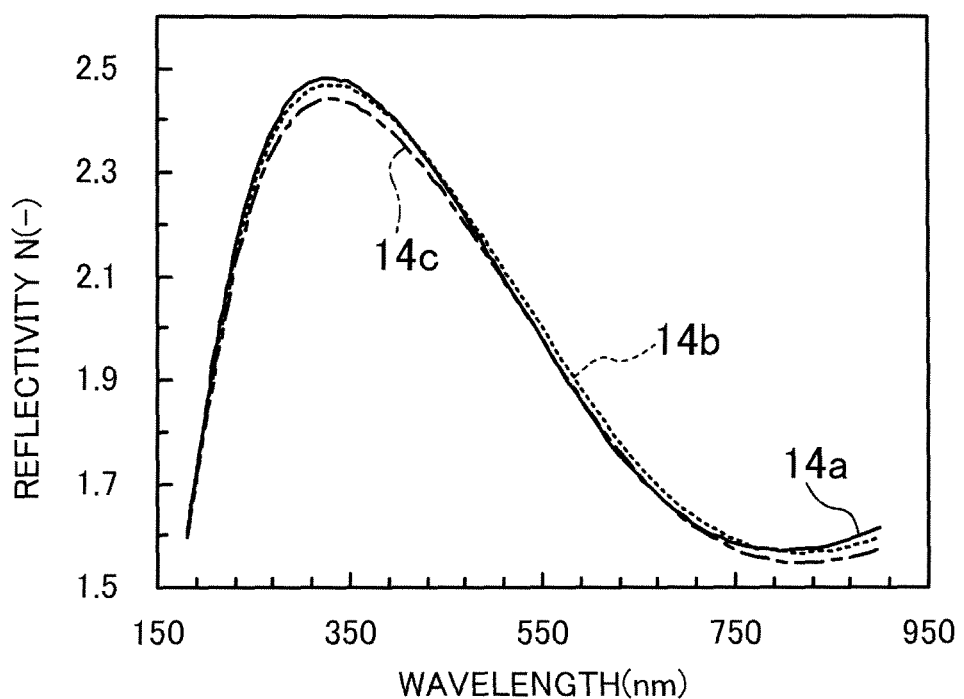
FIG. 17 is a graph illustrating the reflectivity of each of metal films in the semiconductor device according to the second embodiment.
Figure 18:
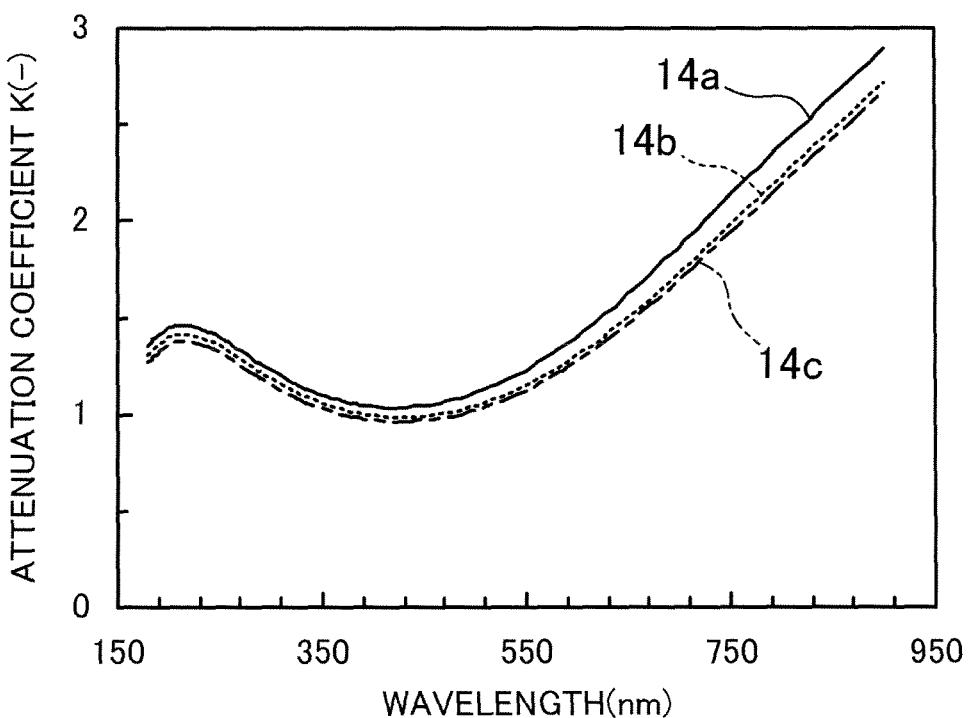
FIG. 18 is a graph illustrating the attenuation coefficient of each of the metal films in the semiconductor device according to the second embodiment.

FIG. 17 illustrates results of comparisons among the reflectivities of the metal film 123, the metal film 124, and the multilayer film of the metal films 123 and 124, and FIG. 18 illustrates results of comparisons among the attenuation coefficients of the metal film 123, the metal film 124, and the multilayer film of the metal films 123 and 124. In FIGS. 17 and 18, the lines 14a, 14b, and 14c illustrate measurement results of the metal film 123, the metal film 124, and the multilayer film of the metal films 123 and 124, respectively. FIGS. 17 and 18 show that the metal film 123, the metal film 124, and the multilayer film of the metal films 123 and 124 possess substantially the same reflectivity and substantially the same attenuation coefficient. Therefore, even when the metal films 123 and 124 are stacked as in this embodiment, the conditions for lithography in the process steps in FIGS. 13A and 13C can be set using an existing facility and existing conditions.

Similarly to the first embodiment, the method for fabricating a semiconductor device according to the second embodiment can reduce such deformation of a separation portion as described with reference to FIGS. 31-34, and prevent poor filling of an interconnect groove with a Cu film. Consequently, the yield and reliability of the semiconductor device can be improved. Furthermore, the dimensional accuracy of each of the interconnect groove patterns 111 to be formed in the process step in FIG. 13A can be improved by using the multilayer film of the metal films 123 and 124 in the process step in FIG. 12C.

In the second embodiment, a situation was described in which a film having low compressive stress is used as the metal film 123, and a film having high density is used as the metal film 124; however, the metal films 123 and 124 are not limited to the above films. For example, lower and upper metal films in each of first to third variations illustrated in FIG. 19 may be used as the metal film 123 serving as the lower metal film and the metal film 124 serving as the upper metal film, respectively. For example, as illustrated in the first variation, a film having low stress can be used as the lower metal film to prevent poor filling of an interconnect groove with Cu, and a film having high density can be used as the upper metal film to provide stable dimensions of interconnect groove patterns. Alternatively, as illustrated in the second variation, a film which is easy to etch in the process step in FIG. 13B may be used as the lower metal film to reduce fabrication cost, and a film having high density may be used as the upper metal film to provide stable dimensions of interconnect groove patterns. Alternatively, as illustrated in the third variation, a film which is hard to etch in the process step in FIG. 14A can be used as the lower metal film to control the via shape, and a film which is hard to etch in the process step in FIG. 14C can be used as the upper metal film to control the shapes of interconnect grooves. As such, when such lower and upper metal films as illustrated in each of the first to third variations are used, this can also reduce the deformation of a separation portion, and prevent poor filling of an interconnect groove with a Cu film. Consequently, the yield and reliability of the semiconductor device can be improved.

Third Embodiment

Figure 20A:
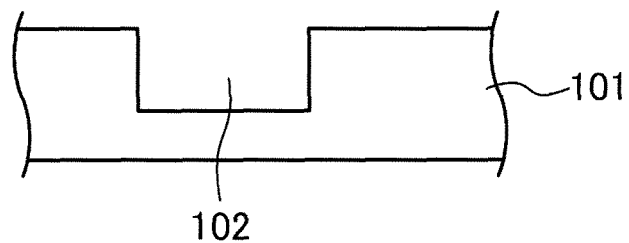
FIGS. 20A-20C are cross-sectional views illustrating process steps in a method for fabricating a semiconductor device according to a third embodiment.

A method for fabricating a semiconductor device according to a third embodiment will be described hereinafter with reference to the drawings. First, as illustrated in FIG. 20A, an insulating film 101 is deposited on the surface of a semiconductor substrate (not shown), and then, an interconnect groove 102 is formed in the insulating film 101 by photolithography and dry etching.

Figure 20B:
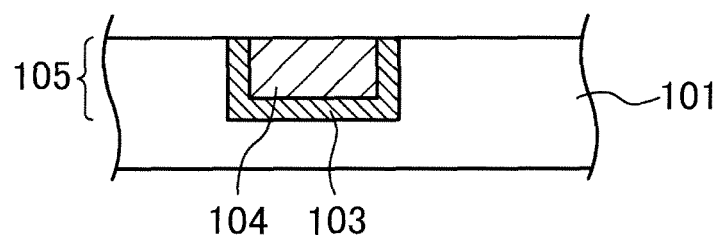

Next, as illustrated in FIG. 20B, a barrier film 103 and a Cu film 104 are sequentially deposited to cover the surface of the insulating film 101 and fill the interior of the interconnect groove 102, and then, a portion of the barrier film 103 and a portion of the Cu film 104 which are located outside the interconnect groove 102 are removed by CMP. Thus, a lower interconnect 105 including a portion of the barrier film 103 and a portion of the Cu film 104 both in the interior of the interconnect groove 102 is formed.

Figure 20C:
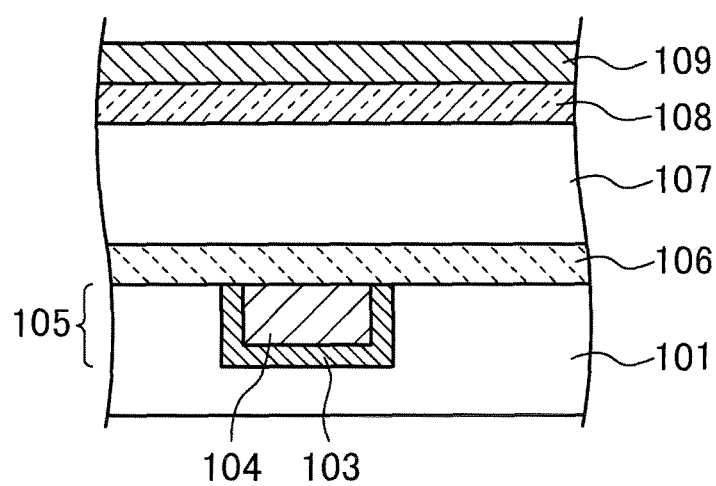

Next, as illustrated in FIG. 20C, a SiC film 106, a SiOC film 107, a SiO$_2$ film 108, and a metal film 109 are sequentially deposited, as a lower interlayer insulating film, an upper interlayer insulating film, a lower hard mask formation film, and an upper hard mask formation film, respectively, on the surface of the insulating film 101 and the surface of the lower interconnect 105. The metal film 109 may be formed, e.g., by reactive PVD, such as reactive sputtering. In this embodiment, a film obtained by sequentially stacking a SiCN film and a SiCO film is used as the SiC film 106. A film obtained by sequentially stacking a SiOC film having a relative dielectric constant k of 2.5 and a SiOC film having a relative dielectric constant k of 3.0 is used as the SiOC film 107. The reason why the SiOC film including the stacked films having the relative dielectric constants k as above is used is similar to that described in the first embodiment.

Figure 21A:
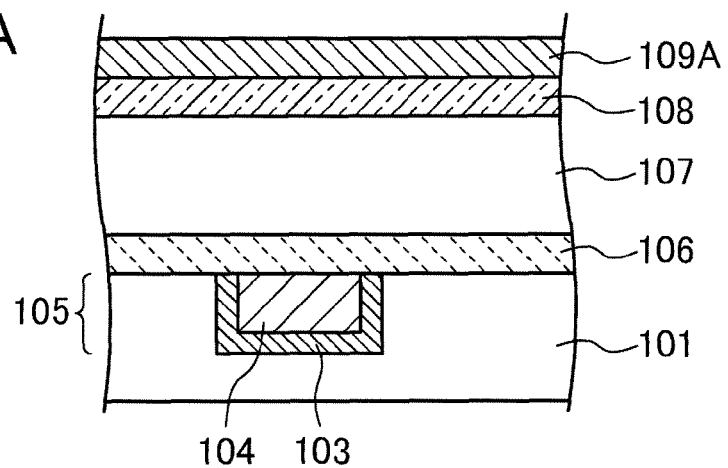
FIGS. 21A-21C are cross-sectional views illustrating process steps in the method for fabricating a semiconductor device according to the third embodiment.

Next, as illustrated in FIG. 21A, the metal film 109 serving as the hard mask formation film is subjected to heat treatment, thereby forming an altered metal film 109A. This heat treatment is performed, e.g., in a nitrogen (N$_2$) atmosphere at a temperature of 300° C. for 30 minutes.

Figure 21B:
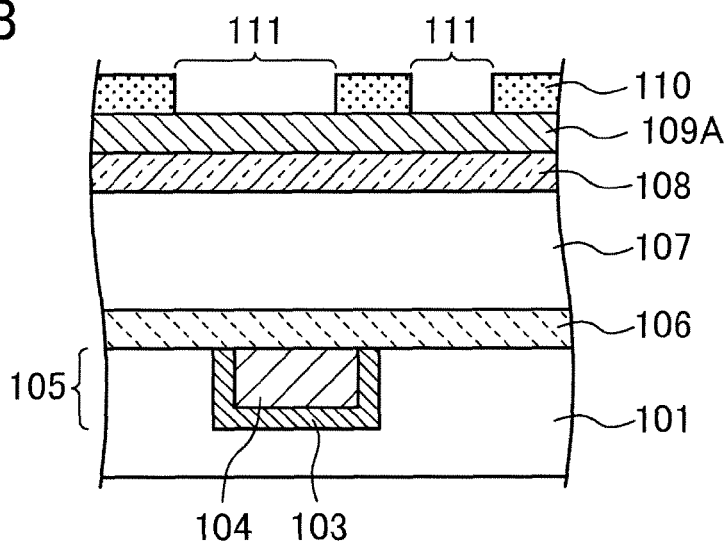

Next, as illustrated in FIG. 21B, a resist 110 is deposited on the surface of the altered metal film 109A, and then, interconnect groove patterns 111 are transferred to the resist 110 by lithography. In this embodiment, a two-layer resist including a lower BARC and an upper resist is used as the resist 110. The minimum width of each of the interconnect groove patterns 111 and the minimum spacing between an adjacent pair of the interconnect groove patterns 111 are set at 60 nm as design rules.

Figure 21C:
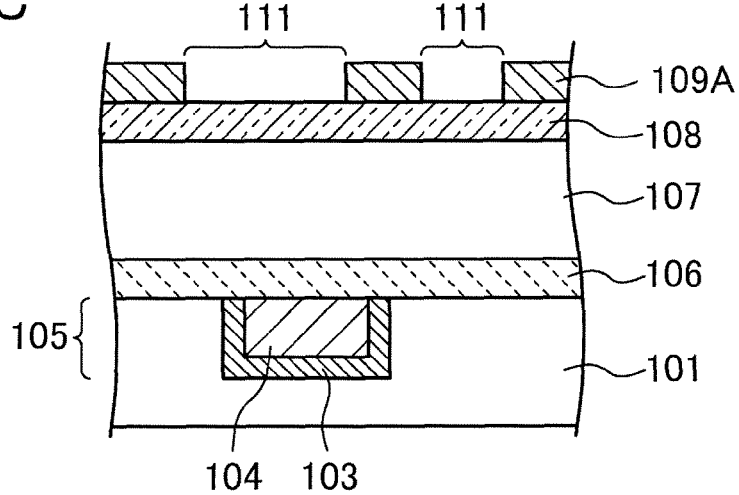

Next, as illustrated in FIG. 21C, the altered metal film 109A is etched using the resist 110 as a mask, and then, the resist 110 is removed.

Next, as illustrated in FIG. 22A, a resist 112 is deposited to cover the surfaces of the $SiO_2$ film 108 and altered metal film 109A, and then, a via pattern 113 is transferred to the resist 112 by lithography. In this embodiment, a three-layer resist including a lower resist, a $SiO_2$ film, and an upper resist is used as the resist 112.

Next, as illustrated in FIG. 22B, the $SiO_2$ film 108 and the SiOC film 107 are etched using the resist 112 as a mask, and then, as illustrated in FIG. 22C, the resist 112 is removed.

Figure 23A:
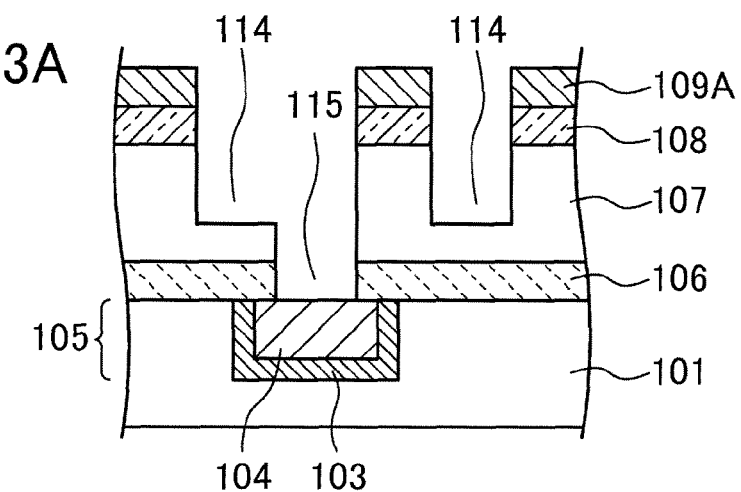
FIGS. 23A-23C are cross-sectional views illustrating process steps in the method for fabricating a semiconductor device according to the third embodiment.

Next, as illustrated in FIG. 23A, the $SiO_2$ film 108, the SiOC film 107, and the SiC film 106 are etched using the altered metal film 109A as a mask to form interconnect grooves 114 and a via hole 115.

Figure 23B:
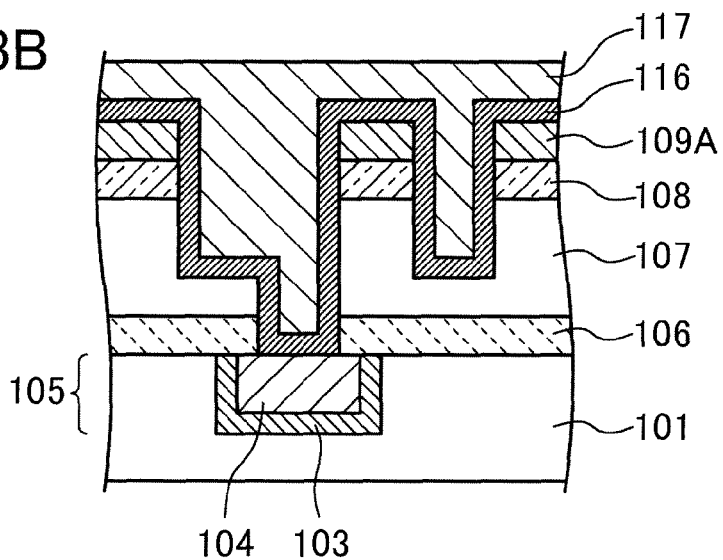

Next, as illustrated in FIG. 23B, a barrier film 116 and a Cu film 117 are sequentially deposited to cover the surface of the altered metal film 109A and fill the interiors of the interconnect grooves 114 and the interior of the via hole 115.

Figure 23C:
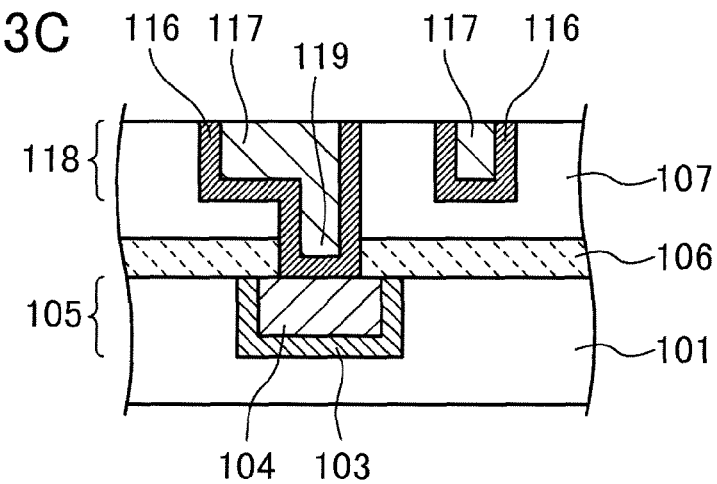

Next, as illustrated in FIG. 23C, a portion of the Cu film 117 and a portion of the barrier film 116 which are located outside each of the interconnect grooves 114, the altered metal film 109A, and the $SiO_2$ film 108 are removed by CMP. Thus, upper interconnects 118 each including a portion of the barrier film 116 and a portion of the Cu film 117 both in a corresponding one of the interconnect grooves 114, and a via 119 including a portion of the barrier film 116 and a portion of the Cu film 117 both in the via hole 115 are formed.

Figure 24:
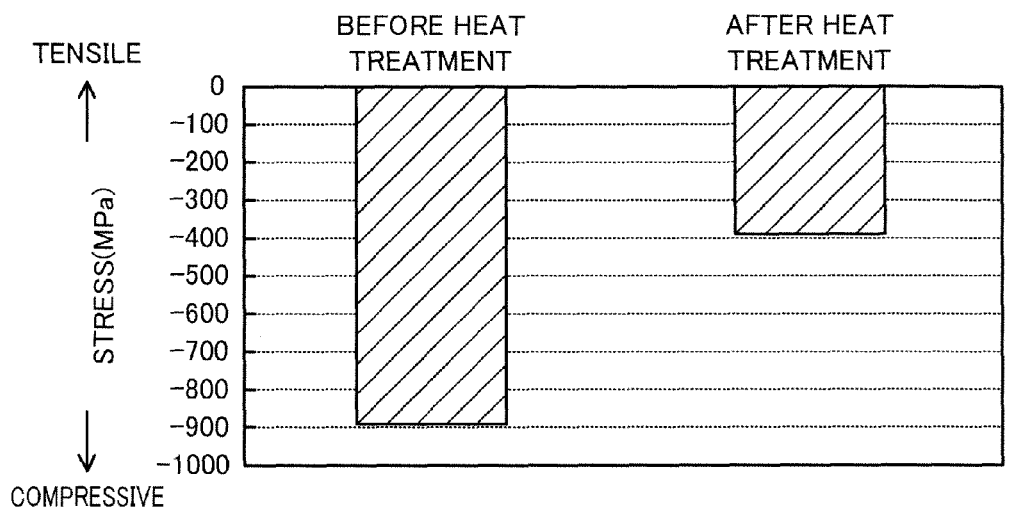
FIG. 24 is a graph illustrating a comparison between the stress of a metal film immediately after the film formation and the stress of the altered metal film.

The properties of the altered metal film 109A formed in the process step in FIG. 21A will be described. FIG. 24 illustrates the stresses of a formed metal film before heat treatment and an altered metal film after heat treatment. It is seen that while the stress of the metal film before heat treatment is about 900 MPa, the stress of the altered metal film after heat treatment is reduced to about 400 MPa. The reason why heat treatment reduces stress is that heat treatment reduces the degree of crystallinity to reduce the size of each of crystal grains, and thus, the stress in the film is reduced due to many crystal grain boundaries.

Figure 25:
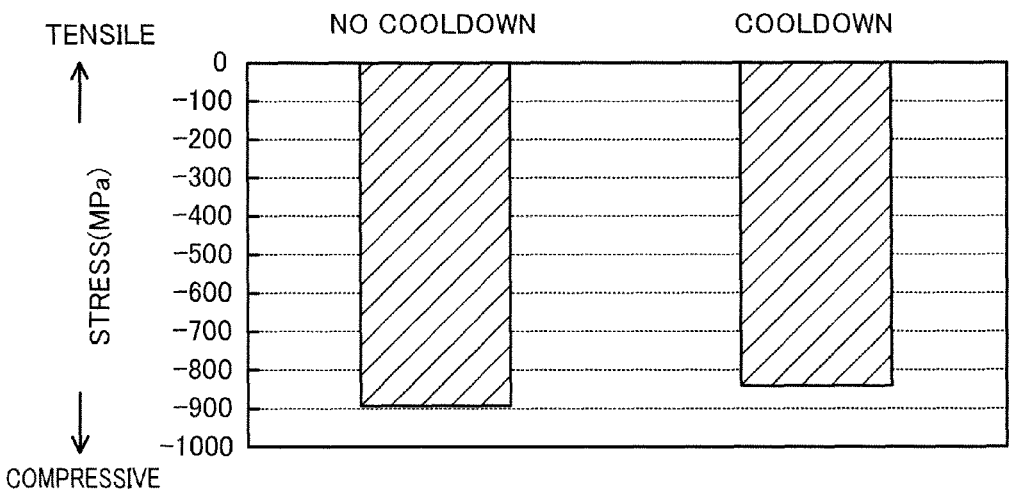
FIG. 25 is a graph illustrating a comparison between the stress of a metal film subjected to a cooldown process and the stress of the metal film which is not subjected to a cooldown process.

A cooldown process may be performed, as a further process for reducing stress, before the formation of the TiN film. The cooldown process may be performed, e.g., in an argon (Ar) atmosphere at a pressure of 3 Torr for three minutes. FIG. 25 illustrates the stress intensity of each of the TiN film subjected to the cooldown process before the formation of the TiN film, and the TiN film which is not subjected to the cooldown process before the formation of the TiN film. It is seen that the cooldown process can reduce stress by about 10%. The reason for this is that the cooldown process before the formation of the TiN film reduces the wafer temperature, the growth of TiN crystals, and the size of each of crystal grains.

According to the semiconductor device fabrication method of the third embodiment, the formation of the altered metal film 109A which has been altered by heat treatment allows the compressive stress of the altered metal film 109A to be set at a sufficiently low stress, thereby reducing the deformation of a separation portion. This reduction can prevent poor filling of an interconnect groove with a Cu film. Consequently, the yield and reliability of the semiconductor device can be improved.

Instead of reactive PVD, CVD or ALD using an organic metallic compound may be used as a process for depositing a metal film 109.

In the third embodiment, an example in which a metal film is altered by heat treatment in the process step in FIG. 21A was described; however, the metal film may be altered by plasma treatment. The plasma treatment may be performed, e.g., in an atmosphere containing hydrogen ($H_2$) and oxygen ($O_2$) at a pressure of 160 Pa and a temperature of 350° C. for three minutes.

Figure 26:
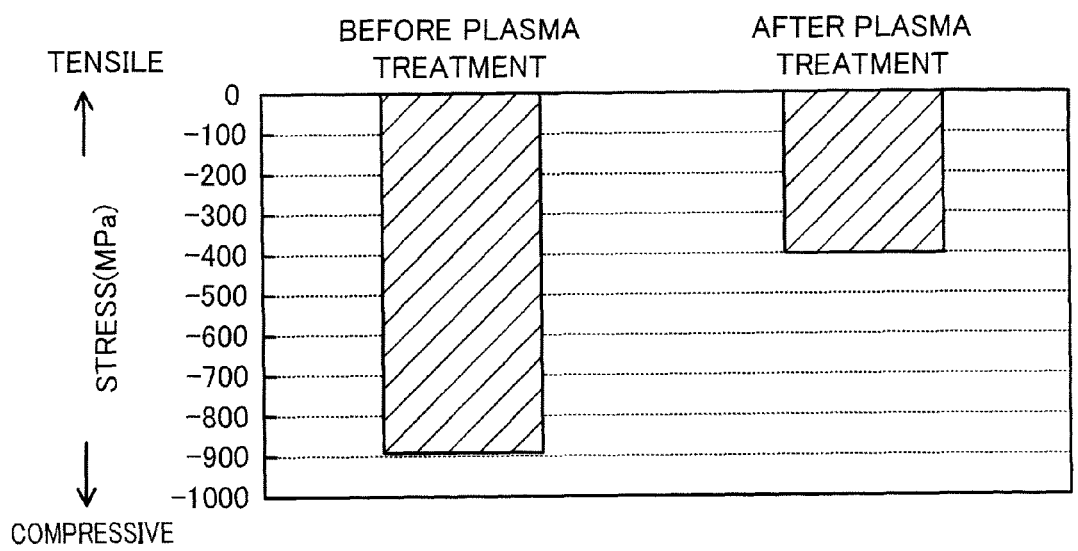
FIG. 26 is a graph illustrating a comparison between the stress of a metal film immediately after the film formation and the stress of the altered metal film.

The properties of the altered metal film which has been altered by plasma treatment will be described. FIG. 26 illustrates the stress of each of a formed metal film before the plasma treatment and an altered metal film after the plasma treatment. While the stress of the metal film before the plasma treatment is about 900 MPa, the stress of the altered metal film after the plasma treatment is reduced to about 400 MPa. The reason why the plasma treatment reduces stress is that, similarly to the heat treatment, plasma treatment reduces the degree of crystallinity to reduce the size of each of crystal grains, and thus, the stress in the film is reduced due to many crystal grain boundaries.

The situation where the metal film is altered by performing heat treatment or plasma treatment alone was described; however, when the metal film is altered by performing both of heat treatment and plasma treatment, this can further reduce the stress in the hard mask formation film.

Moreover, in order to further reduce stress, a cooldown process may be performed before the formation of the hard mask formation film.

In the first through third embodiments, the situation where Cu is used as a conductive material with which interconnect grooves and a via hole are to be filled was described; however, the conductive material is not limited to Cu, and any other conductive materials (e.g., W) can be used.

In the first through third embodiments, the situation where a TiN film is used as a hard mask used to form interconnect grooves 114 was described; however, as long as the conditions where a hard mask is formed are optimized as appropriate, a metal film or a metallic compound film made of, e.g., a Ti (titanium) film, a Ta (tantalum) film, a TaN (tantalum nitride) film, a W (tungsten) film, or a WN (tungsten nitride) film can be used instead of the TiN film. Alternatively, an insulating film made of, e.g., a C (carbon) film, a SiN (silicon nitride) film, or a SiC (silicon carbide) film can be used.

In the first through third embodiments, the situation where a $SiO_2$ film is interposed between a film to be etched (SiOC film) and a hard mask (TiN film) was described; however, a $SiO_2$ film may not be interposed therebetween. In this case, as previously described, when, for example, the etching conditions are set as appropriate, similar advantages are provided even without the $SiO_2$ film interposed therebetween.

In the first through third embodiments, in the method for fabricating a semiconductor device, a process in which interconnects and a via are simultaneously formed (a so-called dual damascene process) was used; however, also when a process in which interconnects and a via are separately formed (a so-called single damascene process) is used, similar advantages are provided.

The features of the first through third embodiments can be combined appropriately as far as no contradiction occurs in such a combination. This can further reduce the film stress in the hard mask.

Even with miniaturization of semiconductor devices, the method for fabricating a semiconductor device according to the present disclosure can reduce the deformation of a separation portion of an interlayer insulating film, and prevent poor filling of an interconnect groove with a conductive material for interconnects, and is useful for, in particular, e.g., a method for fabricating a semiconductor device having a multilayer interconnect structure.

What is claimed is:

1. A method for fabricating a semiconductor device, the method comprising:
    forming an interlayer insulating film on a substrate;
    sequentially forming a first hard mask formation film and a second hard mask formation film on the interlayer insulating film;
    transferring an interconnect groove pattern to the first and second hard mask formation films to form a first hard mask made of the first hard mask formation film and a second hard mask made of the second hard mask formation film; and
    etching the interlayer insulating film using the first and second hard masks to form an interconnect groove in the interlayer insulating film, wherein
    the first and second hard mask formation films contain an identical metal element.

2. The method of claim 1, wherein
    the first hard mask formation film has a compressive stress greater than or equal to 0 Pa and equal to or less than 1000 MPa.

3. The method of claim 1, wherein
    the first hard mask formation film has a smaller crystal size than the second hard mask formation film.

4. The method of claim 1, wherein
    the second hard mask formation film has a higher compressive stress than the first hard mask formation film.

5. The method of claim 1, wherein
    the second hard mask formation film has a higher density than the first hard mask formation film.

6. The method of claim 1, wherein
    after the etching of the interlayer insulating film, the second hard mask is completely removed, or has a thickness equal to or less than 5 nm.

7. The method of claim 1, wherein
    a reflectivity of the first hard mask formation film is substantially equal to a reflectivity of the second hard mask formation film, and an attenuation coefficient of the first hard mask formation film is substantially equal to an attenuation coefficient of the second hard mask formation film.

8. The method of claim 1, wherein
    after the etching of the interlayer insulating film, an interconnect made of copper is formed in the interconnect groove.

9. The method of claim 1, wherein
    the etching of the interlayer insulating film includes forming the interconnect groove including at least three adjacent interconnect grooves between each adjacent pair of which a separation portion of the interlayer insulating film is interposed.

10. The method of claim 1, wherein
    the interlayer insulating film is made of a compound containing silicon.

11. The method of claim 10, wherein
    the interlayer insulating film includes a multilayer film of a silicon oxycarbide film having a relative dielectric constant of 2.5, and a silicon oxycarbide film having a relative dielectric constant of 3.0.

* * * * *